US009263471B2

(12) United States Patent  
Koyama et al.

(10) Patent No.: US 9,263,471 B2  
(45) Date of Patent: Feb. 16, 2016

(54) SEMICONDUCTOR DEVICE AND SEMICONDUCTOR MEMORY DEVICE

(75) Inventors: Jun Koyama, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 656 days.

(21) Appl. No.: 13/336,335

(22) Filed: Dec. 23, 2011

(65) Prior Publication Data

US 2012/0161145 A1  Jun. 28, 2012

(30) Foreign Application Priority Data

Dec. 28, 2010  (JP) ................................. 2010-292496  
May 19, 2011  (JP) ................................. 2011-112538

(51) Int. Cl.
| | |
|---|---|
| *H01L 29/10* | (2006.01) |
| *H01L 27/12* | (2006.01) |
| *H01L 27/115* | (2006.01) |
| *G11C 16/04* | (2006.01) |

(52) U.S. Cl.  
CPC ........ *H01L 27/1225* (2013.01); *H01L 27/1156* (2013.01); *G11C 16/0416* (2013.01)

(58) Field of Classification Search  
CPC ............ H01L 27/1156; H01L 27/1225; G11C 16/0416  
USPC .............................. 257/66, E27.016, E29.255  
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 5,784,323 A * | 7/1998 | Adams .................... G11C 29/02 365/201 |
| 6,127,702 A | 10/2000 | Yamazaki et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| EP | 1 737 044 A1 | 12/2006 |
| EP | 2020686 A | 2/2009 |

(Continued)

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

(Continued)

*Primary Examiner* — Vongsavanh Sengdara  
(74) *Attorney, Agent, or Firm* — Fish & Richardson P.C.

(57) ABSTRACT

An object is at least one of a longer data retention period of a memory circuit, a reduction in power consumption, a smaller circuit area, and an increase in the number of times written data can be read to one data writing operation. The memory circuit has a first field-effect transistor, a second field-effect transistor, and a rectifier element including a pair of current terminals. A data signal is input to one of a source and a drain of the first field-effect transistor. A gate of the second field-effect transistor is electrically connected to the other of the source and the drain of the first field-effect transistor. One of the pair of current terminals of the rectifier element is electrically connected to a source or a drain of the second field-effect transistor.

8 Claims, 29 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,091,547 B2 | 8/2006 | Bartholomäus |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,807,515 B2 | 10/2010 | Kato et al. |
| 7,859,889 B2 | 12/2010 | Kameshiro et al. |
| 7,935,582 B2 | 5/2011 | Iwasaki |
| 7,956,361 B2 | 6/2011 | Iwasaki |
| 8,154,024 B2 | 4/2012 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0227648 A1* | 10/2006 | Kameshiro .......... G11C 7/18 365/230.05 |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0146953 A1* | 6/2007 | Ono .......... H01L 27/0255 361/100 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1* | 5/2009 | Wang .......... H01L 27/1225 257/59 |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0110774 A1 | 5/2010 | Ouchi et al. |
| 2010/0148171 A1 | 6/2010 | Hayashi et al. |
| 2010/0279474 A1* | 11/2010 | Akimoto .......... H01L 29/7869 438/158 |
| 2011/0240988 A1 | 10/2011 | Yano et al. |

FOREIGN PATENT DOCUMENTS

| | | |
|---|---|---|
| EP | 2 226 847 A2 | 9/2010 |
| EP | 2339639 A | 6/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-326272 A | 11/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-529502 A | 9/2004 |
| JP | 2006-294116 A | 10/2006 |
| JP | 2007-103918 A | 4/2007 |
| WO | 2004/114391 A1 | 12/2004 |
| WO | WO-2007/029844 | 3/2007 |
| WO | WO-2007/139009 | 12/2007 |
| WO | 2008/114716 A1 | 9/2008 |
| WO | WO-2010/023889 | 3/2010 |

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

(56) References Cited

OTHER PUBLICATIONS

Wonchan Kim et al.; An Experimental High-Density DRAM Cell with a Built-in Gain Stage; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

"Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931."

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1 Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

(56) References Cited

OTHER PUBLICATIONS

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$—$Ga_2ZnO_4$—$ZnO$ systems at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

FIG. 14A  FIG. 14B
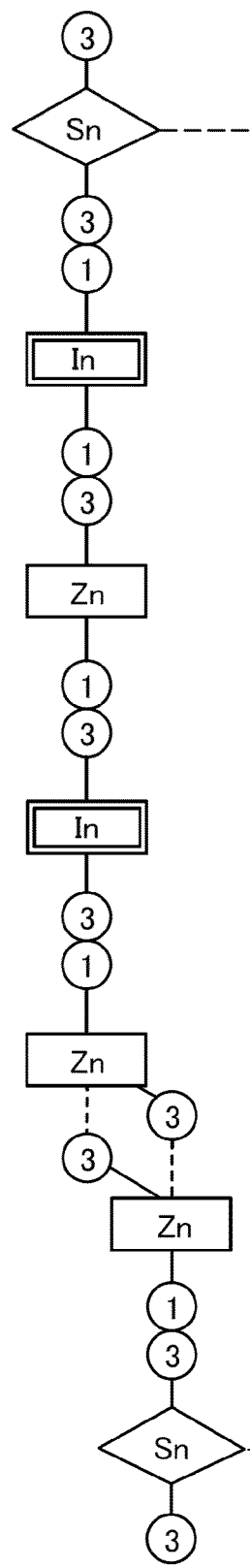
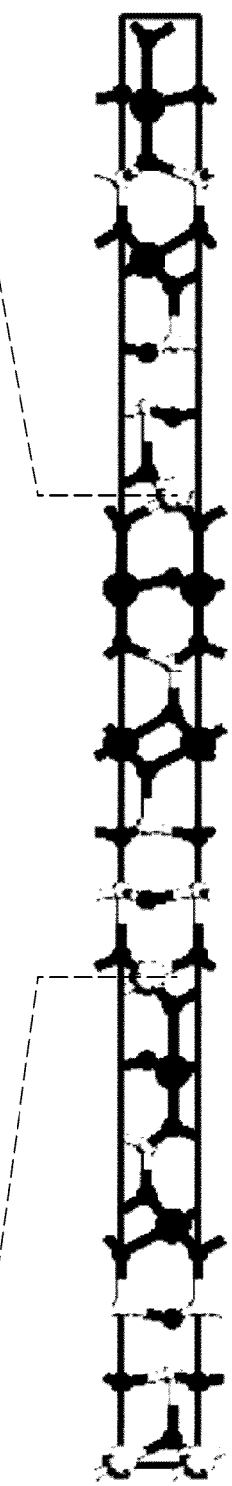
FIG. 14C
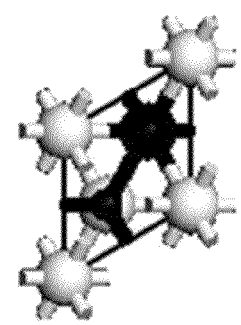
● In
☾ Sn
c Zn
• O

- In
- Ga
- Zn
- O

SEMICONDUCTOR DEVICE AND SEMICONDUCTOR MEMORY DEVICE

BACKGROUND OF THE INVENTION

1. Field of the Invention

One embodiment of the present invention relates to a semiconductor device. Further, one embodiment of the present invention relates to a semiconductor memory device.

2. Description of the Related Art

In recent years, semiconductor devices each including a memory circuit in which data can be written and erased and the data can be retained for a certain period have been developed.

As examples of the above semiconductor device, a dynamic random access memory (also referred to as a DRAM) (for example, see Patent Document 1) and a static random access memory (also referred to as an SRAM) (for example, see Patent Document 2) can be given.

A DRAM disclosed in Patent Document 1 is provided with a memory cell including one transistor and one capacitor. The DRAM disclosed in Patent Document 1 retains data by turning the transistor on and accumulating electric charge in the capacitor.

An SRAM disclosed in Patent Document 2 is provided with a memory cell including six transistors.

REFERENCE

[Patent Document]
[Patent Document 1] Japanese Translation of PCT International Application No. 2004-529502
[Patent Document 2] PCT International Publication No. 2008/114716

SUMMARY OF THE INVENTION

However, a conventional DRAM such as that disclosed in Patent Document 1 has a problem of high power consumption due to a short data retention period; for example, a rewrite operation of the same data (also referred to as a refresh operation) needs to be performed several tens of times per second. In addition, a conventional DRAM such as that disclosed in Patent Document 1 also has a problem in that the number of times data can be read to one data writing operation is one. This is because once the data is read, the data is lost.

Further, a conventional SRAM such as that disclosed in Patent Document 2 also has a problem of high power consumption, as in the case of a conventional DRAM, because power supply needs to be continued during data retention. In addition, in the case of a conventional SRAM, since the number of transistors in a memory cell is large, the area of a circuit is large and integration of the circuits is thus difficult.

An object of one embodiment of the present invention is at least one of a longer data retention period of a memory circuit, a reduction in power consumption, a smaller circuit area, and an increase in the number of times written data can be read to one data writing operation.

In one embodiment of the present invention, a memory cell including two transistors and one rectifier element is provided. With this structure, a reduction in power consumption or an increase in the number of times written data can be read to one data writing operation is achieved while an increase in a circuit area is suppressed.

Further, in one embodiment of the present invention, at least one of the above transistors can be a transistor with low off-state current. Moreover, the transistor may include an oxide semiconductor layer which includes a region to which a dopant is added. By providing the region to which the dopant is added for the oxide semiconductor layer of the transistor, miniaturization of the transistor is achieved.

In one embodiment of the present invention, the oxide semiconductor layer of the transistor can be formed using a material (also referred to as a crystal with c-axis alignment or c-axis aligned crystal; CAAC) which is non-single-crystal and includes a phase which has a triangular, hexagonal, regular triangular, or regular hexagonal atomic arrangement when seen from the direction perpendicular to the a-b plane (also referred to as a plane of a layer) and in which metal atoms are arranged in a layered manner when seen from the direction perpendicular to the c-axis direction (also referred to as a thickness direction of a layer) or metal atoms and oxygen atoms are arranged in a layered manner when seen from the direction perpendicular to the c-axis direction. In this case, deterioration of the transistor due to light is suppressed.

According to one embodiment of the present invention, a data retention period of a memory circuit can be lengthened. Accordingly, power consumption can be reduced. According to one embodiment of the present invention, the number of times written data can be read to one data writing operation can be increased. According to one embodiment of the present invention, a circuit area can be reduced.

BRIEF DESCRIPTION OF THE DRAWINGS

In the accompanying drawings:

FIGS. 14A to 14C illustrate a structure of an oxide material according to one embodiment of the present invention;

DETAILED DESCRIPTION OF THE INVENTION

Examples of embodiments of the present invention will be described below with reference to the drawings. Note that it will be readily appreciated by those skilled in the art that details of the embodiments can be modified in various ways without departing from the spirit and scope of the present invention. The present invention is therefore not limited to the following description of the embodiments.

Note that the details of the embodiments can be combined with each other as appropriate. In addition, the details of the embodiments can be replaced with each other.

Ordinal numbers such as "first" and "second" are used in order to avoid confusion among components, and the number of components is not limited by the number of ordinal numbers.

Embodiment 1

In this embodiment, an example of a semiconductor device that includes a memory circuit capable of storing data for a certain period is described.

Note that a memory circuit is a circuit capable of retaining electric charge as data for a certain period.

The example of the semiconductor device in this embodiment includes a memory circuit.

An example of the memory circuit is described with reference to FIG. 1.

First, an example of a structure of the memory circuit in the semiconductor device in this embodiment is described with reference to FIG. 1.

Figure 1:
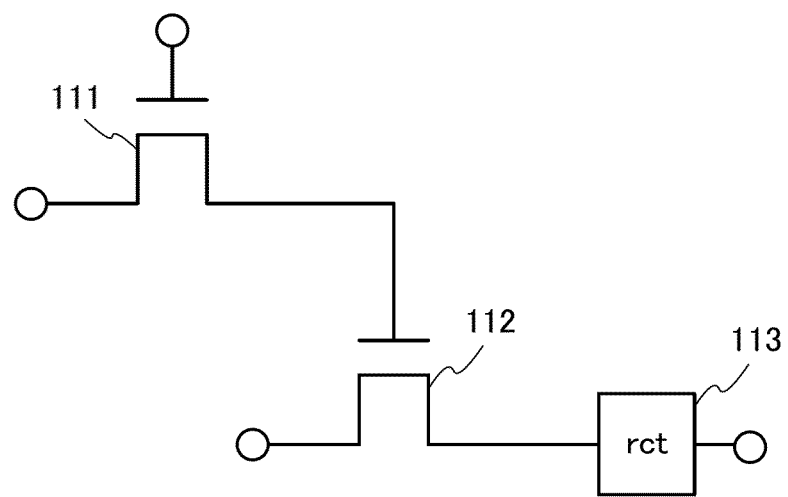
FIG. 1 illustrates an example of a memory circuit in a semiconductor device.

The memory circuit illustrated in FIG. 1 includes a transistor 111, a transistor 112, and a rectifier element (rct) 113.

Note that the transistor includes two terminals and a current control terminal for controlling current flowing between the two terminals by voltage applied. Note that without limitation to the transistor, in an element, terminals where current flowing therebetween is controlled are also referred to as current terminals. Two current terminals are also referred to as a pair of current terminals and such two current terminals are also referred to as a first current terminal and a second current terminal.

Further, a field-effect transistor can be used as the transistor, for example. In a field-effect transistor, a first current terminal, a second current terminal, and a current control terminal are one of a source and a drain, the other of the source and the drain, and a gate, respectively.

Depending on a structure or operation conditions of a transistor, a source and a drain of the transistor are interchanged in some cases.

Further, the rectifier element includes a pair of current terminals and is brought into conduction when the pair of current terminals are brought into conduction in accordance with voltage applied between the pair of current terminals.

The term "voltage" generally means a difference between potentials at two points (also referred to as a potential difference). However, levels of voltage and potentials are represented by volts (V) in a circuit diagram or the like in some cases, so that it is difficult to distinguish them. Thus, in this specification, a potential difference between a potential at one point and a potential to be a reference (also referred to as a reference potential) is used as voltage at the point in some cases unless otherwise specified.

A data signal is input to one of a source and a drain of the transistor 111. The transistor 111 serves as a selection transistor for determining whether or not data is written to the memory circuit. A writing selection signal may be input to a gate of the transistor 111. A writing selection signal is a pulse signal for determining whether or not data is written to the memory circuit.

As the transistor 111, a transistor including an oxide semiconductor layer in which a channel is formed can be used, for example.

The band gap of the oxide semiconductor layer is larger than that of silicon and for example, 2 eV or more, preferably 2.5 eV or more, far preferably 3 eV or more.

Further, such a transistor which includes the oxide semiconductor layer can have lower off-state current than a conventional field-effect transistor which uses silicon.

It is possible to use, as the transistor 111, a transistor which includes an oxide semiconductor layer having a pair of regions which are separated from each other and to which a dopant is added. In the transistor which includes the oxide semiconductor layer having the pair of regions to which the dopant is added, a channel is formed between the pair of regions of the oxide semiconductor layer, to which the dopant is added. It is preferable that resistance of the pair of regions to which the dopant is added be lower than that of a region in which the channel is formed (also referred to as a channel formation region). With the use of the transistor which includes the oxide semiconductor layer having the pair of regions to which the dopant is added, resistance between the region in which the channel is formed (also referred to as the channel formation region) and a source or a drain of the transistor can be low, so that a reduction in the area of the transistor (also referred to as miniaturization of the transistor) is possible.

As the oxide semiconductor layer, it is possible to use, for example, an oxide semiconductor layer formed using a material which is non-single-crystal and includes a phase which has a triangular, hexagonal, regular triangular, or regular hexagonal atomic arrangement when seen from the direction perpendicular to the a-b plane and in which metal atoms are arranged in a layered manner when seen from the direction perpendicular to the c-axis direction or metal atoms and oxygen atoms are arranged in a layered manner when seen from the direction perpendicular to the c-axis direction. By using an oxide semiconductor layer including CAAC as a layer in which a channel of a transistor is formed (also referred to as a channel formation layer), deterioration of the transistor due to light, for example, can be suppressed.

A gate of the transistor 112 is electrically connected to the other of the source and the drain of the transistor 111.

Note that as long as there exists a period during which two or more components are electrically connected, the two or more components can be said to be electrically connected.

As the transistor 112, for example, it is possible to use a transistor which includes a semiconductor layer including a semiconductor belonging to Group 14 of the periodic table (e.g., silicon) or the above oxide semiconductor layer as a layer in which a channel is formed.

Note that the semiconductor layer including a semiconductor belonging to Group 14 may be a single crystal semiconductor layer, a polycrystalline semiconductor layer, a microcrystalline semiconductor layer, or an amorphous semiconductor layer.

One of the pair of current terminals of the rectifier element 113 is electrically connected to a source or a drain of the transistor 112. Here, the source or the drain of the transistor 112, to which one of the pair of current terminals of the rectifier element 113 is not electrically connected, is "one of the source and the drain of the transistor 112"; the source or the drain of the transistor 112, to which one of the pair of current terminals of the rectifier element 113 is electrically connected, is "the other of the source and the drain of the transistor 112". A reading selection signal may be input to the other of the pair of current terminals of the rectifier element 113. A reading selection signal is a pulse signal for determining whether or not data is read from the memory circuit. The rectifier element 113 is a switching element which determines whether or not data is read from the memory circuit.

Next, an example of a method for driving the memory circuit in FIG. 1 is described.

In the case where data is written to the memory circuit, the transistor 111 is turned on. For example, the transistor 111 is turned on by changing the voltage of the gate of the transistor 111. Further, at this time, a value of the voltage of the other of the pair of current terminals of the rectifier element 113 and a value of the voltage of one of the source and the drain of the transistor 112 are set such that the rectifier element 113 is brought out of conduction. For example, it is preferable that the value of the voltage of the other of the pair of current terminals of the rectifier element 113 be equivalent to the value of the voltage of one of the source and the drain of the transistor 112.

When the transistor 111 is on, a data signal is input through the source and the drain of the transistor 111, and the voltage of the gate of the transistor 112 has a value based on the voltage of the data signal input. Thus, data is written to the memory circuit.

After that, when the transistor 111 is turned off, the gate of the transistor 112 is in a floating state, so that the voltage of the gate of the transistor 112 is held for a predetermined period.

In the case where data is read from the memory circuit, the value of the voltage of the other of the pair of current terminals of the rectifier element 113 is set such that an absolute value of a difference between the voltage of one of the source and the drain of the transistor 112 and the voltage of the other of the pair of current terminals of the rectifier element 113 is larger than or equal to a value of voltage necessary for bringing the rectifier element 113 into conduction. The voltage at this time is also referred to as a reading voltage.

Resistance between the source and the drain of the transistor 112 depends on the voltage of the gate of the transistor 112. In accordance with current flowing between the source and the drain of the transistor 112, whether or not the rectifier element 113 is brought into conduction is determined and the voltage of the other of the pair of current terminals of the rectifier element 113 is set. For example, the voltage of the other of the pair of current terminals of the rectifier element 113 changes when the transistor 112 is turned on and the rectifier element 113 is brought into conduction. Therefore, in the memory circuit, the voltage of the other of the pair of current terminals of the rectifier element 113 can be read from the memory circuit as data. Further, during a period in which the transistor 111 is in an off state, the voltage of the gate of the transistor 112 is held for a predetermined period; thus, the voltage of the other of the pair of current terminals of the rectifier element 113 can be read from the memory circuit as data more than once. The above is description of an example of a method for driving the semiconductor device illustrated in FIG. 1.

The above is description of an example of the semiconductor device in this embodiment.

In an example of the semiconductor device in this embodiment, a memory circuit can include two field-effect transistors and one rectifier element, whereby the area of the circuit can be made smaller than that of a memory cell of a conventional SRAM, for example.

In an example of the semiconductor device in this embodiment, the number of times written data can be read to one data writing operation can be increased by setting the voltage of a gate of a second field-effect transistor, which is electrically connected to a source or a drain of a first field-effect transistor to a value based on the voltage of a data signal.

In addition, in an example of the semiconductor device in this embodiment, a field-effect transistor with low off-state current is used as the first field-effect transistor, whereby a data retention period can be lengthened. Therefore, even if a refresh operation is needed, for example, the number of times of refresh operations can be smaller; thus, power consumption can be reduced and the capacitance of a capacitor added to the gate of the second field-effect transistor can be reduced or the capacitor can be omitted.

Embodiment 2

In this embodiment, an example of a semiconductor memory device is described as an example of the semiconductor device in the above embodiment.

An example of a semiconductor memory device in this embodiment includes a memory cell array including a plurality of memory cells arranged in a matrix of i rows (i is a natural number of 2 or more) and j columns (j is a natural number). The memory cell corresponds to the memory circuit in the semiconductor device in the above embodiment.

An example of the memory cell array in the semiconductor memory device in this embodiment is described with reference to FIGS. 2A to 2C.

First, an example of the circuit structure of the memory cell array in the semiconductor memory device in this embodiment is described with reference to FIG. 2A.

Figure 2A:
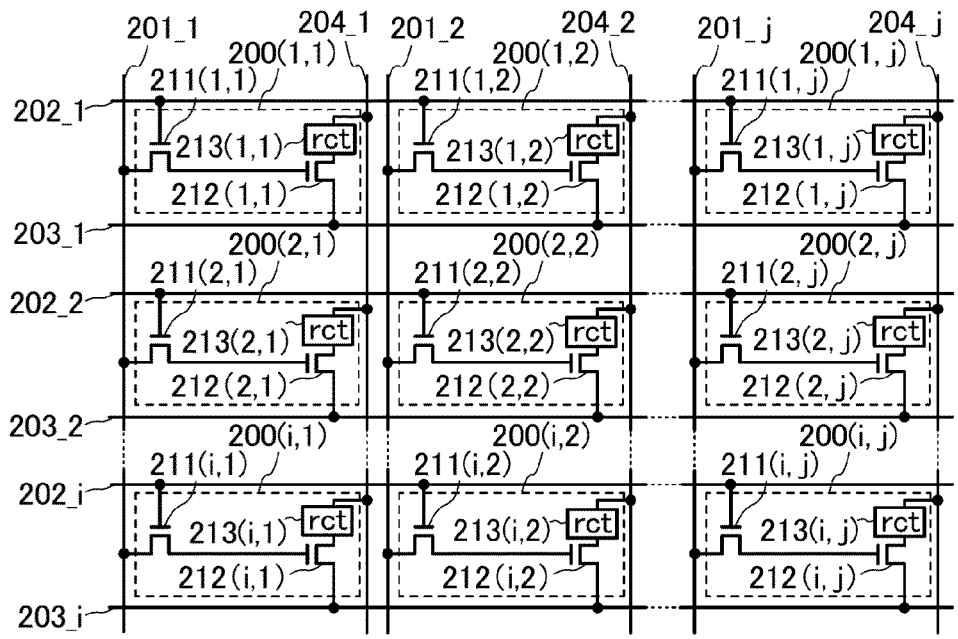
FIGS. 2A to 2C illustrate an example of a memory cell array in a semiconductor memory device.

A memory cell array illustrated in FIG. 2A includes a plurality of memory cells 200 arranged in a matrix of i rows and j columns; j wirings 201 (wirings 201_1 to 201_j); i wirings 202 (wirings 202_1 to 202_i); i wirings 203 (wirings 203_1 to 203_$i$); and j wirings 204 (wirings 204_1 to 204_$j$). Note that in description of the memory cell array illustrated in FIG. 2A, i is a natural number of 3 or more and j is a natural number of 3 or more, for convenience.

The memory cell 200 stores data.

The voltage of the wirings 201_1 to 201_$j$ is controlled by, for example, a driver circuit including a decoder. The wirings 201_1 to 201_$j$ can be referred to as bit lines or data lines, for example.

The voltage of the wirings 202_1 to 202_$i$ is controlled by, for example, a driver circuit including a decoder. The wirings 202_1 to 202_$i$ can be referred to as word lines, for example.

The voltage of the wirings 203_1 to 203_$i$ is controlled by, for example, a driver circuit including a decoder. The wirings 203_1 to 203_$i$ can be referred to as source lines, for example.

The voltage of the wirings 204_1 to 204_$j$ is controlled by, for example, a driver circuit including a decoder. The wirings 204_1 to 204_$j$ can be referred to as selection lines, for example.

The memory cell 200 (M, N) in an M-th row (M is a natural number of i or less) and an N-th column (N is a natural number of j or less) includes a transistor 211 (M, N), a transistor 212 (M, N), and a rectifier element (also referred to as rct) 213 (M, N).

One of a source and a drain of the transistor 211 (M, N) is electrically connected to the wiring 201_N. A gate of the transistor 211 (M, N) is electrically connected to the wiring 202_M.

The transistor 211 (M, N) determines whether or not data is written. Note that the transistor 211 (M, N) can be referred to as a selection transistor, for example.

As the transistor 211 (M, N), a transistor that can be used as the transistor 111 in the semiconductor device in Embodiment 1 can be used.

One of a source and a drain of the transistor 212 (M, N) is electrically connected to the wiring 203_M. A gate of the transistor 212 (M, N) is electrically connected to the other of the source and the drain of the transistor 211 (M, N).

The transistor 212 (M, N) sets a value of data to be output. Note that the transistor 212 (M, N) can be referred to as an output transistor, for example.

As the transistor 212 (M, N), a transistor that can be used as the transistor 112 in the semiconductor device in Embodiment 1 can be used.

One of a pair of current terminals of the rectifier element 213 (M, N) is electrically connected to the wiring 204_N. The other of the pair of current terminals of the rectifier element 213 (M, N) is electrically connected to the other of the source and the drain of the transistor 212 (M, N).

As the rectifier element 213 (M, N), for example, a diode, or a field-effect transistor whose drain and gate are electrically connected to each other can be used.

For example, in the case where a diode is used as the rectifier element 213 (M, N) and the transistor 212 (M, N) is an n-channel transistor, an anode of the diode serves as one of the pair of current terminals of the rectifier element 213 (M, N), and a cathode of the diode serves as the other of the pair of current terminals of the rectifier element 213 (M, N). On the other hand, in the case where the transistor 212 (M, N) is a p-channel transistor, the cathode of the diode serves as one of the pair of current terminals of the rectifier element 213 (M, N), and the anode of the diode serves as the other of the pair of current terminals of the rectifier element 213 (M, N).

Alternatively, when a field-effect transistor whose drain and gate are electrically connected to each other is used as the rectifier element 213 (M, N), for example, one of a source and the drain of the field-effect transistor serves as one of the pair of current terminals of the rectifier element 213 (M, N), and the other of the source and the drain of the field-effect transistor serves as the other of the pair of current terminals of the rectifier element 213 (M, N).

Further, an example of a method for driving the memory cell array in FIG. 2A is described with reference to FIGS. 2B and 2C. FIGS. 2B and 2C are timing charts each illustrating an example of a method for driving the memory cell array in FIG. 2A. Here, the case where data is sequentially written to the memory cells 200 (the memory cells 200 (M, 1) to 200 (M, j)) in the M-th row and then the data written is read is described as an example; however, the present invention is not limited to this example and data writing or data reading can be performed for the memory cells 200 individually.

First, in the case where data is written to the memory cells 200 in the M-th row, the transistors 211 (M, 1) to 211 (M, j) in the memory cells 200 in the M-th row are turned on. Note that at this time, the rectifier elements 213 (1, 1) to 213 (i, j) in all the memory cells 200 are preferably brought out of conduction. By bringing the rectifier elements 213 (1, 1) to 213 (i, j) out of conduction, current does not flow through the source and the drain of the transistor 212 (M, N) and the pair of current terminals of the rectifier element 213 (M, N) in the memory cell 200 in the M-th row and the N-th column at the time of data writing, whereby power consumption can be reduced.

Figure 2B:
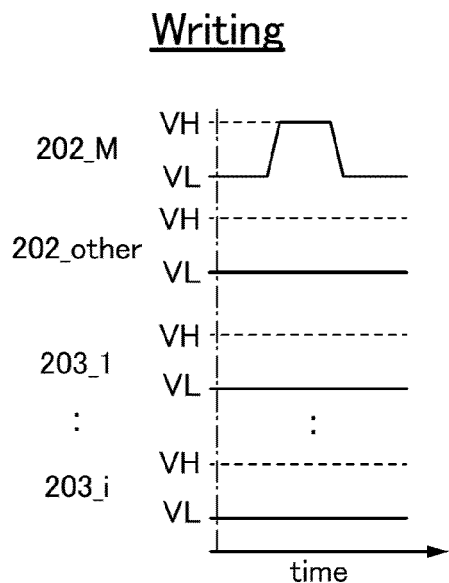

For example, in the case where the transistors 211 (M, 1) to 211 (M, j) in the memory cells 200 in the M-th row are n-channel transistors, by setting the voltage of the wiring 202_M in the M-th row to voltage VH as illustrated in FIG. 2B, the transistors 211 (M, 1) to 211 (M, j) in the memory cells 200 in the M-th row can be turned on. The voltage VH is, for example, voltage having a larger value than reference potential. Further, at this time, the voltage of the wirings 202_1 to 202_$i$ other than the wiring 202_M in the M-th row (also referred to as the wirings 202_other) is set to voltage VL. Furthermore, at this time, the rectifier element 213 (M, N) can be brought out of conduction by setting the voltage of the wirings 203_1 to 203_$i$ to the voltage VL and setting the voltage of the wirings 204_1 to 204_$j$ to the voltage VL. The voltage VL is, for example, lower than or equal to the reference potential. At this time, an absolute value of a difference between the voltage VH and the voltage VL is preferably larger than an absolute value of the threshold voltage of the transistor 211 (M, N).

When the transistors 211 (M, 1) to 211 (M, j) in the memory cells 200 in the M-th row are in an on state, a data signal is input to the memory cells 200 in the M-th row from the wirings 201_1 to 201_$j$, so that the voltage of the gates of the transistors 212 (M, 1) to 212 (M, j) has a value based on the voltage of the data signal input, and the memory cells 200 in the M-th row are in a written state.

Then, the transistors 211 (M, 1) to 211 (M, j) in the memory cells 200 in the M-th row are turned off, whereby the voltage of each of the gates of the transistors 212 (M, 1) to 212 (M, j) in the memory cells 200 in the M-th row is held for a predetermined period.

In addition, when the above-described operation is repeatedly performed for the memory cells 200 in each row, data can be written to all the memory cells 200.

Further, in the case where data is read from the memory cells 200 in the M-th row, a value of the voltage of the wiring 203_M is set such that an absolute value of a difference between the voltage of the wiring 203_M in the M-th row and the voltage of each of the wirings 204_1 to 204_$j$ is larger than or equal to a value of voltage necessary for bringing the rectifier elements 213 (M, 1) to 213 (M, j) in the memory cells 200 in the M-th row into conduction. Further, the voltage of the wirings 203_1 to 203_*i* other than the wiring 203_M in the M-th row is set equivalent to the voltage of each of the wirings 204_1 to 204_*j*, whereby the data can be read only from the memory cells 200 in the M-th row. Further, at this time, the transistors 211 (1, 1) to 211 (i, j) in all the memory cells 200 are turned off.

Figure 2C:
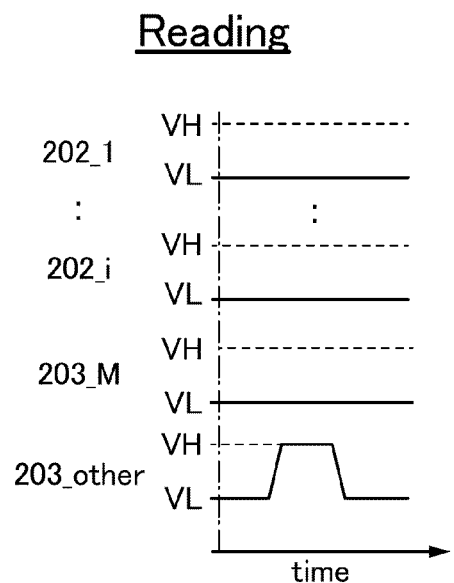

For example, in the case where the transistors 211 (M, 1) to 211 (M, j) and the transistors 212 (M, 1) to 212 (M, j) in the memory cells 200 in the M-th row are n-channel transistors, as illustrated in FIG. 2C, the voltage of the wiring 203_M is set to the voltage VL; the voltage of the wirings 203_1 to 203_*i* other than the wiring 203_M (also referred to as the wirings 203_other) is set to the voltage VH; and the voltage of the wirings 204_1 to 204_*j* is set to the voltage VH. Further, at this time, the voltage of the wirings 202_1 to 202_*i* is set to the voltage VL.

Resistance between the source and the drain of each of the transistors 212 (M, 1) to 212 (M, j) in the memory cells 200 in the M-th row depends on the voltage of the gate of each of the transistors 212 (M, 1) to 212 (M, j). Further, in accordance with current flowing between the source and the drain of each of the transistors 212 (M, 1) to 212 (M, j), whether or not the rectifier elements 213 (M, 1) to 213 (M, j) in the memory cells 200 in the M-th row are brought into conduction is determined and the voltage of the wirings 204_1 to 204_*j* is set. Therefore, when the voltage of the wirings 204_1 to 204_*j* at this time is used as data, the data can be read from the memory cells 200 in the M-th row. Moreover, during a period in which the transistors 211 (M, 1) to 211 (M, j) are in an off state, the voltage of the gates of the transistors 212 (M, 1) to 212 (M, j) is held for a predetermined period; thus, it is possible to read the voltage of the wirings 204_1 to 204_*j* as the data from the memory cells 200 in the M-th row more than once.

In addition, when the above-described operation is performed for the memory cells 200 in each row, the data can be read from all the memory cells (the memory cells 200 (1, 1) to 200 (i, j)). The above is description of an example of a method for driving the semiconductor memory device illustrated in FIG. 2A.

Another example of the semiconductor memory device in this embodiment is described.

Another example of a semiconductor memory device in this embodiment includes a memory cell array including a plurality of memory cells arranged in a matrix of i rows and j columns.

Further, an example of the memory cell array in the semiconductor memory device in this embodiment is described with reference to FIGS. 3A to 3C. Note that description of the semiconductor memory device described with reference to FIGS. 2A to 2C is referred to as appropriate for portions that are the same as those of the semiconductor memory device described with reference to FIGS. 2A to 2C.

First, an example of the circuit structure of the memory cell array in the semiconductor memory device in this embodiment is described with reference to FIG. 3A.

Figure 3A:
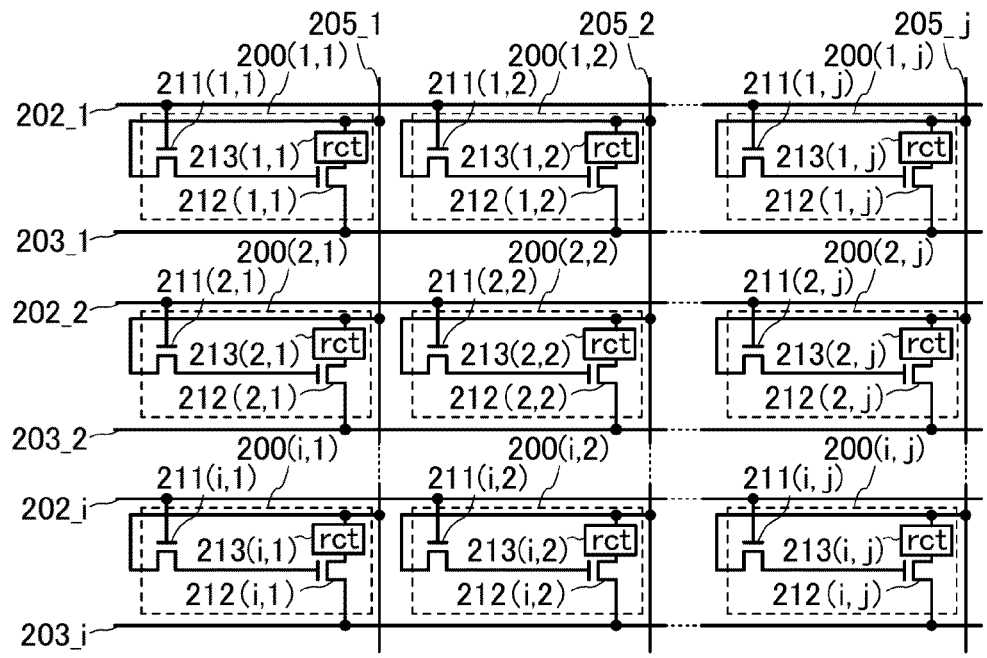
FIGS. 3A to 3C illustrate an example of a memory cell array in a semiconductor memory device.

A memory cell array illustrated in FIG. 3A includes the plurality of memory cells 200 arranged in a matrix of i rows and j columns; j wirings 205 (wirings 205_1 to 205_*j*); the i wirings 202 (wirings 202_1 to 202_*i*); and the i wirings 203 (wirings 203_1 to 203_*i*). Note that in description of the memory cell array illustrated in FIG. 3A, i is a natural number of 3 or more and j is a natural number of 3 or more, for convenience.

The voltage of the wirings 205_1 to 205_*j* is controlled by, for example, a driver circuit including a decoder. The wirings 205_1 to 205_*j* can be referred to as bit lines or data lines.

The memory cell 200 (M, N) in the M-th row and the N-th column includes the transistor 211 (M, N), the transistor 212 (M, N), and the rectifier element 213 (M, N).

One of the source and the drain of the transistor 211 (M, N) is electrically connected to the wiring 205_N. The gate of the transistor 211 (M, N) is electrically connected to the wiring 202_M.

The transistor 211 (M, N) determines whether or not data is input.

One of the source and the drain of the transistor 212 (M, N) is electrically connected to the wiring 203_M. The gate of the transistor 212 (M, N) is electrically connected to the other of the source and the drain of the transistor 211 (M, N).

The transistor 212 (M, N) sets a value of data to be output.

One of the pair of current terminals of the rectifier element 213 (M, N) is electrically connected to the wiring 205_N. The other of the pair of current terminals of the rectifier element 213 (M, N) is electrically connected to the other of the source and the drain of the transistor 212 (M, N).

Further, an example of a method for driving the memory cell array in FIG. 3A is described with reference to FIGS. 3B and 3C. FIGS. 3B and 3C are timing charts each illustrating an example of a method for driving the memory cell array in FIG. 3A. Here, the case where data is sequentially written to the memory cells 200 (the memory cells 200 (M, 1) to 200 (M, j)) in the M-th row and then the data written is read is described as an example; however, the present invention is not limited to this example and data writing or data reading can be performed for the memory cells 200 individually.

First, in the case where data is written to the memory cells 200 in the M-th row, the transistors 211 (M, 1) to 211 (M, j) in the memory cells 200 in the M-th row are turned on. Note that at this time, the rectifier elements 213 (1, 1) to 213 (i, j) in all the memory cells 200 are preferably brought out of conduction. By bringing the rectifier elements 213 (1, 1) to 213 (i, j) out of conduction, current does not flow through the source and the drain of the transistor 212 (M, N) and the pair of current terminals of the rectifier element 213 (M, N) in the memory cell 200 in the M-th row and the N-th column at the time of data writing, whereby power consumption can be reduced.

Figure 3B:
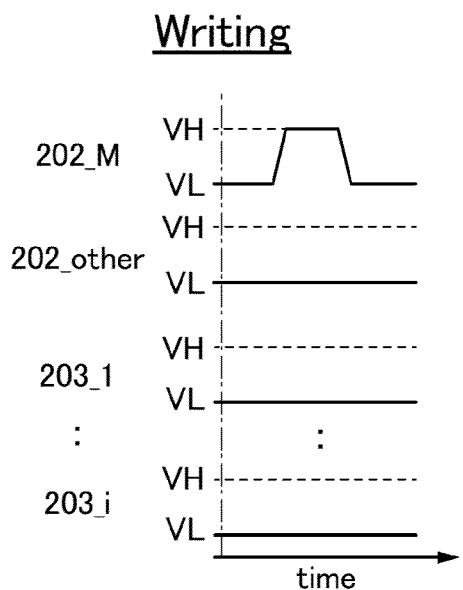

For example, in the case where the transistors 211 (M, 1) to 211 (M, j) in the memory cells 200 in the M-th row are n-channel transistors, by setting the voltage of the wiring 202_M in the M-th row to the voltage VH as illustrated in FIG. 3B, the transistors 211 (M, 1) to 211 (M, j) in the memory cells 200 in the M-th row can be turned on. Further, at this time, the voltage of the wirings 202_1 to 202_*i* other than the wiring 202_M is set to the voltage VL.

When the transistors 211 (M, 1) to 211 (M, j) in the memory cells 200 in the M-th row are in an on state, a data signal is input to the memory cells 200 in the M-th row from the wirings 205_1 to 205_*j*, so that the voltage of the gates of the transistors 212 (M, 1) to 212 (M, j) has a value based on the voltage of the data signal input, and the memory cells 200 in the M-th row are in a written state.

Then, the transistors 211 (M, 1) to 211 (M, j) in the memory cells 200 in the M-th row are turned off, whereby the voltage of each of the gates of the transistors 212 (M, 1) to 212 (M, j) in the memory cells 200 in the M-th row is held for a predetermined period.

In addition, when the above-described operation is repeatedly performed for the memory cells 200 in each row, data can be written to all the memory cells 200.

Further, in the case where data is read from the memory cells 200 in the M-th row, a value of the voltage of the wiring 203_M is set such that an absolute value of a difference between the voltage of the wiring 203_M in the M-th row and the voltage of each of the wirings 205_1 to 205_j is larger than or equal to a value of voltage necessary for bringing the rectifier elements 213 (M, 1) to 213 (M, j) in the memory cells 200 in the M-th row into conduction. Further, the voltage of the wirings 203_1 to 203_i other than the wiring 203_M is set equivalent to the voltage of each of the wirings 205_1 to 205_j, whereby the data can be read only from the memory cells 200 in the M-th row.

Figure 3C:
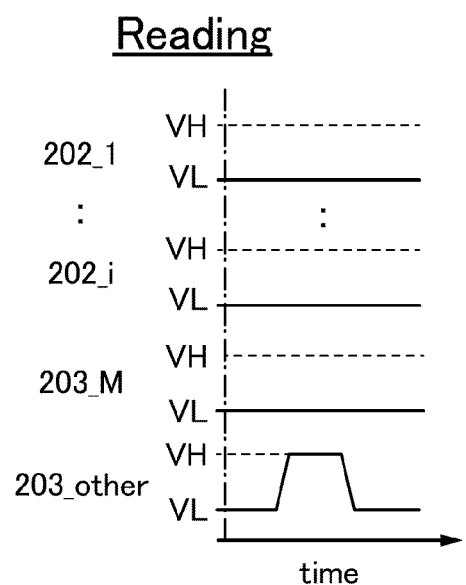

For example, in the case where the transistors 212 (M, 1) to 212 (M, j) in the memory cells 200 in the M-th row are n-channel transistors, as illustrated in FIG. 3C, the voltage of the wiring 203_M is set to the voltage VL; the voltage of the wirings 203_1 to 203_i other than the wiring 203_M is set to the voltage VH; and the voltage of the wirings 205_1 to 205_j is set to the voltage VH. Further, at this time, the voltage of the wirings 202_1 to 202_i is set to the voltage VL.

Resistance between the source and the drain of each of the transistors 212 (M, 1) to 212 (M, j) in the memory cells 200 in the M-th row depends on the voltage of the gate of each of the transistors 212 (M, 1) to 212 (M, j). Further, in accordance with current flowing between the source and the drain of each of the transistors 212 (M, 1) to 212 (M, j), whether or not the rectifier elements 213 (M, 1) to 213 (M, j) in the memory cells 200 in the M-th row are brought into conduction is determined and the voltage of the wirings 205_1 to 205_j is set. Therefore, when the voltage of the wirings 205_1 to 205_j at this time is used as data, the data can be read from the memory cells 200 in the M-th row. Moreover, during a period in which the transistors 211 (M, 1) to 211 (M, j) are in an off state, the voltage of the gates of the transistors 212 (M, 1) to 212 (M, j) is held for a predetermined period; thus, it is possible to read the voltage of the wirings 205_1 to 205_j as the data from the memory cells 200 in the M-th row more than once.

In addition, when the above-described operation is performed for the memory cells 200 in each row, the data can be read from all the memory cells (the memory cells 200 (1, 1) to 200 (i, j)). The above is description of an example of a method for driving the semiconductor memory device illustrated in FIG. 3A.

The above is description of an example of the semiconductor memory device in Embodiment 2.

In this embodiment, the number of times written data can be read to one data writing operation can be increased by setting the voltage of a gate of a second field-effect transistor, which is electrically connected to a source or a drain of a first field-effect transistor to a value based on the voltage of a data signal.

Further, in this embodiment, by using a field-effect transistor with low off-state current as the first field-effect transistor, a data retention period can be lengthened, and the capacitance of a capacitor added to the gate of the second field-effect transistor can be reduced or the capacitor can be omitted. Thus, even when a refresh operation is needed, for example, an interval between refresh operations can be made 10 years or longer.

Moreover, in an example of the semiconductor device in this embodiment, a wiring electrically connected to a source or a drain of the first field-effect transistor and a wiring electrically connected to a first current terminal of a rectifier element are the same (common) wiring, whereby the number of wirings can be reduced and the area of the semiconductor memory device can be made small.

Embodiment 3

In this embodiment, an example of a transistor including an oxide semiconductor layer which can be used for a semiconductor device or a semiconductor memory device in the above embodiment is described.

Examples of structures of the transistors in this embodiment are described with reference to FIGS. 4A to 4D. FIGS. 4A to 4D are cross-sectional schematic views each illustrating an example of a structure of a transistor in this embodiment. Note that the components illustrated in FIGS. 4A to 4D include those having sizes different from the actual sizes.

Figure 4A:
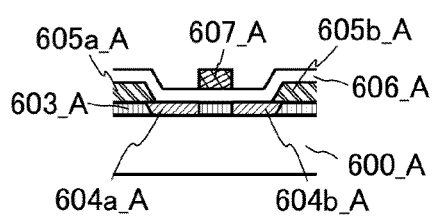
FIGS. 4A to 4D are cross-sectional schematic views each illustrating an example of a structure of a transistor.

A transistor illustrated in FIG. 4A is one of top-gate transistors.

The transistor illustrated in FIG. 4A includes a semiconductor layer 603_A, a conductive layer 605a_A, a conductive layer 605b_A, an insulating layer 606_A, and a conductive layer 607_A.

The semiconductor layer 603_A includes a region 604a_A and a region 604b_A that are regions which are separated from each other and to which a dopant is added. A region between the region 604a_A and the region 604b_A serves as a channel formation region. The semiconductor layer 603_A is provided over an element formation layer 600_A, for example.

The conductive layer 605a_A is provided over the semiconductor layer 603_A and is electrically connected to the semiconductor layer 603_A. Further, a side surface of the conductive layer 605a_A is tapered and the conductive layer 605a_A partly overlaps with the region 604a_A; however, the present invention is not necessarily limited thereto. When the conductive layer 605a_A partly overlaps with the region 604a_A, resistance between the conductive layer 605a_A and the region 604a_A can be low. Further, an entire region of the semiconductor layer 603_A, which overlaps with the conductive layer 605a_A may be the region 604a_A.

The conductive layer 605b_A is provided over the semiconductor layer 603_A and is electrically connected to the semiconductor layer 603_A. Further, a side surface of the conductive layer 605b_A is tapered and the conductive layer 605b_A partly overlaps with the region 604b_A; however, the present invention is not necessarily limited thereto. When the conductive layer 605b_A partly overlaps with the region 604b_A, resistance between the conductive layer 605b_A and the region 604b_A can be low. Further, an entire region of the semiconductor layer 603_A, which overlaps with the conductive layer 605b_A may be the region 604b_A.

The insulating layer 606_A is provided over the semiconductor layer 603_A, the conductive layer 605a_A, and the conductive layer 605b_A.

The conductive layer 607_A overlaps with the semiconductor layer 603_A with the insulating layer 606_A interposed therebetween. A region of the semiconductor layer 603_A, which overlaps with the conductive layer 607_A with the insulating layer 606_A interposed therebetween serves as the channel formation region.

Figure 4B:
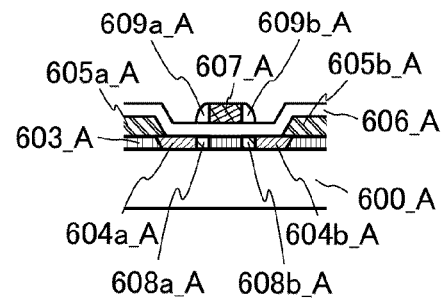

A transistor illustrated in FIG. 4B has the structure illustrated in FIG. 4A to which an insulating layer 609a_A and an insulating layer 609b_A are added; moreover, the semiconductor layer 603_A includes, between the region 604a_A and the region 604b_A, a region 608a_A and a region 608b_A that are regions which are separated from each other and to which a dopant is added.

The insulating layer 609a_A is provided over the insulating layer 606_A and is in contact with one of a pair of side surfaces of the conductive layer 607_A which face each other.

The insulating layer 609b_A is provided over the insulating layer 606_A and is in contact with the other of the pair of side surfaces of the conductive layer 607_A which face each other.

The region 608a_A overlaps with the insulating layer 609a_A with the insulating layer 606_A interposed therebetween. Further, the concentration of the dopant of the region 608a_A may be lower than that of the dopant of the region 604a_A and the region 604b_A. In that case, the region 608a_A is also referred to as a low concentration region.

The region 608b_A overlaps with the insulating layer 609b_A with the insulating layer 606_A interposed therebetween. Further, the concentration of the dopant of the region 608b_A may be lower than that of the dopant of the region 604a_A and the region 604b_A. In that case, the region 608b_A is also referred to as a low concentration region. Further, in that case, the region 604a_A and the region 604b_A may be referred to as high concentration regions.

When the region 608a_A and the region 608b_A are provided, local electric field concentration on the transistor can be suppressed and the reliability of the transistor can be increased even when the area of the transistor is small.

Figure 4C:
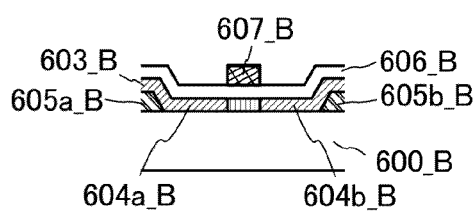

A transistor illustrated in FIG. 4C is one of top-gate transistors.

The transistor illustrated in FIG. 4C includes a semiconductor layer 603_B, a conductive layer 605a_B, a conductive layer 605b_B, an insulating layer 606_B, and a conductive layer 607_B.

The conductive layer 605a_B is provided over an element formation layer 600_B. Further, a side surface of the conductive layer 605a_B is tapered.

The conductive layer 605b_B is provided over the element formation layer 600_B. Further, a side surface of the conductive layer 605b_B is tapered.

The semiconductor layer 603_B includes a region 604a_B and a region 604b_B that are regions which are separated from each other and to which a dopant is added. A region between the region 604a_B and the region 604b_B serves as a channel formation region. The semiconductor layer 603_B is provided over the conductive layer 605a_B, the conductive layer 605b_B, and the element formation layer 600_B, for example.

The region 604a_B is electrically connected to the conductive layer 605a_B.

The region 604b_B is electrically connected to the conductive layer 605b_B.

The insulating layer 606_B is provided over the semiconductor layer 603_B.

The conductive layer 607_B overlaps with the semiconductor layer 603_B with the insulating layer 606_B interposed therebetween. A region of the semiconductor layer 603_B, which overlaps with the conductive layer 607_B with the insulating layer 606_B interposed therebetween serves as the channel formation region.

Figure 4D:
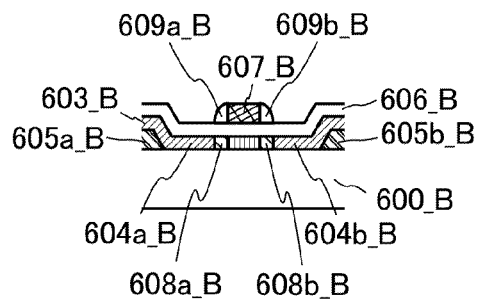

A transistor illustrated in FIG. 4D has the structure illustrated in FIG. 4C to which an insulating layer 609a_B and an insulating layer 609b_B are added; moreover, the semiconductor layer 603_B includes, between the region 604a_B and the region 604b_B, a region 608a_B and a region 608b_B that are regions which are separated from each other and to which a dopant is added.

The insulating layer 609a_B is provided over the insulating layer 606_B and is in contact with one of a pair of side surfaces of the conductive layer 607_B which face each other.

The insulating layer 609b_B is provided over the insulating layer 606_B and is in contact with the other of the pair of side surfaces of the conductive layer 607_B which face each other.

The region 608a_B overlaps with the insulating layer 609a_B with the insulating layer 606_B interposed therebetween. Further, the concentration of the dopant of the region 608a_B may be lower than that of the dopant of the region 604a_B and the region 604b_B. In that case, the region 608a_B is also referred to as a low concentration region.

The region 608b_B overlaps with the insulating layer 609b_B with the insulating layer 606_B interposed therebetween. Further, the concentration of the dopant of the region 608b_B may be lower than that of the dopant of the region 604a_B and the region 604b_B. In that case, the region 608b_B is also referred to as a low concentration region. Further, in that case, the region 604a_B and the region 604b_B may be referred to as high concentration regions.

When the region 608a_B and the region 608b_B are provided, local electric field concentration on the transistor can be suppressed and the reliability of the transistor can be increased.

Next, the components illustrated in FIGS. 4A to 4D are described.

As the element formation layer 600_A and the element formation layer 600_B, insulating layers, substrates having insulating surfaces, or the like can be used, for example. Further, layers over which elements are formed in advance can be used as the element formation layer 600_A and the element formation layer 600_B.

The semiconductor layer 603_A and the semiconductor layer 603_B serve as channel formation layers of the transistors. As the semiconductor layer 603_A and the semiconductor layer 603_B, oxide semiconductor layers can be used.

An oxide semiconductor to be used preferably contains at least indium (In) or zinc (Zn). In particular, In and Zn are preferably contained. As a stabilizer for reducing variation in electric characteristics of a transistor including the oxide semiconductor, it is preferable that gallium (Ga) be additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For the oxide semiconductor layer, an oxide semiconductor containing four-component metal oxide, three-component metal oxide, two-component metal oxide, or the like can be used.

For example, as the four-component metal oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

For example, as the three-component metal oxide, an In—Ga—Zn-based oxide (also referred to as IGZO), an In—Sn—Zn-based oxide, an In—Al—Zn-based oxide, Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, or the like can be used.

For example, as the two-component metal oxide, an In—Zn-based oxide, a Sn—Zn-based oxide, an Al—Zn-based oxide, a Zn—Mg-based oxide, a Sn—Mg-based oxide, an In—Mg-based oxide, an In—Sn-based oxide, an In—Ga-based oxide, or the like can be used.

Further, as the semiconductor layer 603_A and the semiconductor layer 603_B, for example, a layer of indium oxide, tin oxide, zinc oxide, or the like can be used. The metal oxide which can be used for the oxide semiconductor may contain silicon oxide. The metal oxide which can be used for the oxide semiconductor may contain nitrogen.

In the case where an In—Zn—O-based metal oxide is used, for example, an oxide target having the following composition ratios can be used for formation of an In—Zn—O-based metal oxide semiconductor layer: In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=15:1 to 1.5:1 ($In_2O_3$:ZnO=15:2 to 3:4 in a molar ratio). For example, when the atomic ratio of the target used for the formation of the In—Zn—O-based oxide semiconductor is expressed by In:Zn:O=P:Q:R, R>1.5P+Q. The increase in the In content can make the mobility of the transistor higher.

Note that here, for example, an "In—Ga—Zn-based oxide" means an oxide containing In, Ga, and Zn as its main component, in which there is no particular limitation on the ratio of In:Ga:Zn. The In—Ga—Zn-based oxide may contain a metal element other than In, Ga, and Zn.

As the semiconductor layer 603_A and the semiconductor layer 603_B, a layer containing a material represented by $InLO_3(ZnO)_m$ (m>0, m is not an integer) can be used. Here, L in $InLO_3(ZnO)_m$ represents one or more metal elements selected from Ga, Al, Fe, Mn, and Co. Alternatively, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relationship: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of 1 nm or less, preferably 0.3 nm or less, further preferably 0.1 nm or less.

Note that the average surface roughness ($R_a$) is a value obtained by expanding, into three dimensions, center line average roughness that is defined by JIS B 0601 so as to be able to apply it to a plane. The $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ represents the area of a measurement plane (a rectangular region which is defined by four points represented by coordinates $(x_1, y_1)$, $(x_1, y_2)$, $(x_2, y_1)$ and $(x_2, y_2)$), and $Z_0$ represents an average height of the measurement plane. $R_a$ can be measured using an atomic force microscope (AFM). The measurement plane is a plane where all the measurement data are shown, and the measurement data consists of three parameters (X, Y, Z) and is represented by Z=F (X, Y). The range of X (and Y) is from 0 to $X_{max}$ (and $Y_{max}$), and the range of Z is from $Z_{min}$ to $Z_{max}$.

At least regions of the semiconductor layer 603_A and the semiconductor layer 603_B, in which the channels are formed may be non-single-crystal and include a phase which has a triangular, hexagonal, regular triangular, or regular hexagonal atomic arrangement when seen from the direction perpendicular to the a-b plane and in which metal atoms are arranged in a layered manner when seen from the direction perpendicular to the c-axis direction or metal atoms and oxygen atoms are arranged in a layered manner when seen from the direction perpendicular to the c-axis direction.

A dopant imparting one conductivity type is added to the region 604a_A and the region 604a_B, and the region 604a_A and the region 604a_B serve as one of a source and a drain of a transistor. Note that a region serving as a source of a transistor is also referred to as a source region, and a region serving as a drain of a transistor is also referred to as a drain region.

A dopant imparting one conductivity type is added to the region 604b_A and the region 604b_B, and the region 604b_A and the region 604b_B serve as the other of the source and the drain of the transistor.

The region 608a_A, the region 608b_A, the region 608a_B, and the region 608b_B may have lower resistance than the channel formation regions, and have higher resistance than the region 604a_A, the region 604b_A, the region 604a_B, and the region 604b_B. Note that the region 608a_A, the region 608b_A, the region 608a_B, and the region 608b_B are also referred to as low-resistance regions.

As the dopants contained in the region 604a_A, the region 604b_A, the region 608a_A, the region 608b_A, the region 604a_B, the region 604b_B, the region 608a_B, and the region 608b_B, for example, one or more elements selected from elements belonging to Group 15 of the periodic table (e.g., one or more of nitrogen, phosphorus, and arsenic) and rare gas elements (e.g., one or more of helium, argon, and xenon) can be given.

The concentration of the dopants contained in the region 604a_A, the region 604b_A, the region 604a_B, and the region 604b_B is preferably $5\times10^{19}$ cm$^{-3}$ or higher, for example. For example, the region 604a_A, the region 604b_A, the region 604a_B, and the region 604b_B may contain nitrogen at a concentration of higher than or equal to $1\times10^{20}$ cm$^{-3}$ and lower than 7 atomic %.

The concentration of the dopants contained in the region 608a_A, the region 608b_A, the region 608a_B, and the region 608b_B is preferably higher than or equal to $5\times10^{18}$ cm$^{-3}$ and lower than $5\times10^{19}$ cm$^{-3}$, for example.

In addition, the region 604b_A, the region 604b_A, the region 608a_A, the region 608b_A, the region 604a_B, the region 604b_B, the region 608a_B, and the region 608b_B may have lower crystallinity than the channel formation regions.

Further, the region 604a_A, the region 604b_A, the region 604a_B, and the region 604b_B may contain a crystal having a wurtzite structure.

Further, the region 608a_A, the region 608b_A, the region 608a_B, and the region 608b_B may contain a crystal having a wurtzite structure.

For example, the region 604a_A, the region 604b_A, the region 608a_A, the region 608b_A, the region 604a_B, the region 604b_B, the region 608a_B, and the region 608b_B can contain a crystal having a wurtzite structure by heat treatment after the addition of the dopants.

When the region to which the dopant is added contains a crystal having a wurtzite structure, resistance between the channel formation region and the source or drain of the transistor can be low.

The conductive layer 605a_A, the conductive layer 605a_B, the conductive layer 605b_A, and the conductive layer 605b_B serve as the source or the drain of the transistor. Note that a layer serving as a source of a transistor is also referred to as a source electrode or a source wiring, and a layer serving as a drain of a transistor is also referred to as a drain electrode or a drain wiring.

Each of the conductive layer 605a_A, the conductive layer 605a_B, the conductive layer 605b_A, and the conductive layer 605b_B can be, for example, a layer of a metal material such as aluminum, chromium, copper, tantalum, titanium, molybdenum, or tungsten; or an alloy material which contains any of the above metal materials as a main component. As a layer of an alloy material, a layer of a Cu—Mg—Al alloy material can be used, for example.

Further, each of the conductive layer 605a_A, the conductive layer 605a_B, the conductive layer 605b_A, and the conductive layer 605b_B can be a layer containing conductive metal oxide. Note that silicon oxide may be contained in conductive metal oxide that can be used for the conductive layer 605a_A, the conductive layer 605a_B, the conductive layer 605b_A, and the conductive layer 605b_B.

Further, each of the conductive layer 605a_A, the conductive layer 605a_B, the conductive layer 605b_A, and the conductive layer 605b_B can be formed by stacking layers formed using materials that can be used for the conductive layer 605a_A, the conductive layer 605a_B, the conductive layer 605b_A, and the conductive layer 605b_B. For example, when each of the conductive layer 605a_A, the conductive layer 605a_B, the conductive layer 605b_A, and the conductive layer 605b_B is formed by stacking a layer of copper over a layer of a Cu—Mg—Al alloy material, the conductive layer 605a_A, the conductive layer 605a_B, the conductive layer 605b_A, and the conductive layer 605b_B can have high adhesiveness with a layer which is in contact therewith.

As the insulating layer 606_A and the insulating layer 606_B, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. Further, each of the insulating layer 606_A and the insulating layer 606_B can be formed by stacking layers formed using materials that can be used for the insulating layer 606_A and the insulating layer 606_B.

Alternatively, as each of the insulating layer 606_A and the insulating layer 606_B, an insulating layer of a material containing an element that belongs to Group 13 of the periodic table and oxygen can be used, for example.

Examples of the material containing an element that belongs to Group 13 and oxygen include gallium oxide, aluminum oxide, aluminum gallium oxide, and gallium aluminum oxide. Note that aluminum gallium oxide is a substance in which the amount of aluminum is larger than that of gallium in atomic percent, and gallium aluminum oxide is a substance in which the amount of gallium is larger than or equal to that of aluminum in atomic percent.

The conductive layer 607_A and the conductive layer 607_B serve as gates of the transistors. Note that such a conductive layer serving as a gate of the transistor is also referred to as a gate electrode or a gate wiring.

Each of the conductive layer 607_A and the conductive layer 607_B can be, for example, a layer of a metal material such as aluminum, chromium, copper, tantalum, titanium, molybdenum, or tungsten; or an alloy material which contains any of the above metal materials as a main component. Further, each of the conductive layer 607_A and the conductive layer 607_B can be formed by stacking layers formed using materials that can be used for the conductive layer 607_A and the conductive layer 607_B.

Further, each of the conductive layer 607_A and the conductive layer 607_B can be a layer containing conductive metal oxide. Note that silicon oxide may be contained in conductive metal oxide that can be used for the conductive layer 607_A and the conductive layer 607_B.

Further, a layer of an In—Ga—Zn—O—N-based material can be used as the conductive layer 607_A and the conductive layer 607_B. A layer of an In—Ga—Zn—O—N-based material has high conductivity and is thus suitable for the conductive layer 607_A and the conductive layer 607_B.

As the insulating layer 609a_A, the insulating layer 609b_A, the insulating layer 609a_B, and the insulating layer 609b_B, for example, a layer of a material that can be used for the insulating layer 606_A and the insulating layer 606_B can be used. Further, each of the insulating layer 609a_A, the insulating layer 609b_A, the insulating layer 609a_B, and the insulating layer 609b_B can be formed by stacking layers formed using materials that can be used for the insulating layer 609a_A, the insulating layer 609b_A, the insulating layer 609a_B, and the insulating layer 609b_B.

Note that an insulating layer may be further provided over the insulating layer 606_A with the conductive layer 607_A interposed therebetween or over the insulating layer 606_B with the conductive layer 607_B interposed therebetween.

Note that it is possible to suppress incidence of light on the semiconductor layer when the transistor in this embodiment has a structure in which the entire semiconductor layer overlaps with the conductive layer serving as the gate electrode. In this case, the region to which the dopant is added is not necessarily provided in the semiconductor layer.

The above is description of a structure example of each of the transistors illustrated in FIGS. 4A to 4D.

Next, as an example of a method for manufacturing the transistor in this embodiment, an example of a method for manufacturing the transistor illustrated in FIG. 4A will be described with reference to FIGS. 5A to 5E. FIGS. 5A to 5E are cross-sectional schematic views illustrating an example of a method for manufacturing the transistor in this embodiment.

Figure 5A:
FIGS. 5A to 5E are cross-sectional schematic views illustrating an example of a method for manufacturing a transistor.

First, as illustrated in FIG. 5A, the semiconductor layer 603_A is formed over the element formation layer 600_A.

An example of a method for forming an oxide semiconductor layer including CAAC as an example of the semiconductor layer 603_A is described below.

An example of the method for forming an oxide semiconductor layer including CAAC includes a step of forming a semiconductor film over the element formation layer 600_A. Note that in an example of a method for forming the semiconductor layer 603_A, one of or both a step of performing heat treatment once or more than once and a step of removing part of the semiconductor film may be included. In that case, a timing of the step of removing part of the semiconductor film is not particularly limited as long as the step is performed after formation of the semiconductor film before formation of the conductive layer 605a_A and the conductive layer 605b_A. Further, a timing of the step of performing the heat treatment is not particularly limited as long as the step is performed after formation of the semiconductor film.

In the step of forming the semiconductor film over the element formation layer 600_A, for example, the semiconductor film is formed by formation of a film of a material that can be used for the semiconductor layer 603_A by sputtering. At this time, the temperature of the element formation layer over which the semiconductor film is formed is set to higher than or equal to 100° C. and lower than or equal to 500° C., preferably higher than or equal to 200° C. and lower than or equal to 350° C. With a high temperature of the element formation layer over which the semiconductor film is formed, the semiconductor film can include a phase which has a triangular, hexagonal, regular triangular, or regular hexagonal atomic arrangement when seen from the direction perpendicular to the a-b plane and in which metal atoms are arranged in a layered manner when seen from the direction perpendicular to the c-axis direction or metal atoms and oxygen atoms are arranged in a layered manner when seen from the direction perpendicular to the c-axis direction.

Further, in the case where the semiconductor layer 603_A is formed with the use of an In—Sn—Zn-based oxide (ITZO), an oxide target in which an atomic ratio of In, Sn, and Zn is 1:2:2, 2:1:3, 1:1:1, 20:45:35, or the like is used.

In the step of performing the heat treatment, heat treatment (also referred to as heat treatment A) is performed at higher than or equal to 400° C. and lower than or equal to 750° C., or higher than or equal to 400° C. and lower than the strain point of the substrate, for example. Note that a timing of the heat treatment A is not particularly limited as long as the heat treatment is performed after formation of the semiconductor film.

By the heat treatment A, the crystallinity of the semiconductor layer 603_A can be increased.

Note that a heat treatment apparatus for the heat treatment A can be an electric furnace or an apparatus for heating an object by heat conduction or heat radiation from a heater such as a resistance heater. For example, an RTA (rapid thermal annealing) apparatus such as a GRTA (gas rapid thermal annealing) apparatus, or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the high-temperature gas, for example, a rare gas or an inert gas (e.g., nitrogen) which does not react with an object by heat treatment can be used.

After the heat treatment A, a high-purity oxygen gas, a high-purity $N_2O$ gas, or ultra-dry air (with a dew point of −40° C. or lower, preferably −60° C. or lower) may be introduced into the furnace that has been used in the heat treatment A while the heating temperature is maintained or decreased. In that case, it is preferable that water, hydrogen, and the like be not contained in the oxygen gas or the $N_2O$ gas. The purity of the oxygen gas or the $N_2O$ gas which is introduced into the heat treatment apparatus is preferably 6N or higher, more preferably 7N or higher. That is, the impurity concentration in the oxygen gas or the $N_2O$ gas is 1 ppm or lower, preferably 0.1 ppm or lower. By the action of the oxygen gas or the $N_2O$ gas, oxygen is supplied to the semiconductor film or the semiconductor layer 603_A, so that defects caused by oxygen deficiency in the semiconductor film or the semiconductor layer 603_A can be reduced.

Figure 5B:
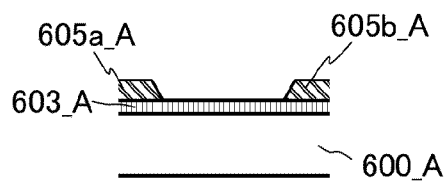

Then, as illustrated in FIG. 5B, a first conductive film is formed over part of the semiconductor layer 603_A and is partly etched, so that the conductive layer 605a_A and the conductive layer 605b_A are formed.

For example, the first conductive film can be formed by formation of a film formed using a material that can be used for the conductive layer 605a_A and the conductive layer 605b_A by sputtering or the like. Alternatively, the first conductive film can be formed by stacking films formed using materials that can be used for the conductive layer 605a_A and the conductive layer 605b_A.

In the case where a film is partly etched in the example of the method for manufacturing a transistor in this embodiment as in formation of the conductive layer 605a_A and the conductive layer 605b_A, the film may be etched in such a manner that a resist mask is formed over part of the film through photolithography and is used, for example. Note that in that case, the resist mask is preferably removed after the etching. In addition, the resist mask may be formed using an exposure mask having a plurality of regions with different transmittances (such an exposure mask is also referred to as a multi-tone mask). With the multi-tone mask, a resist mask having a plurality of regions with different thicknesses can be formed, so that the number of resist masks used for the formation of the transistor can be reduced.

Figure 5C:
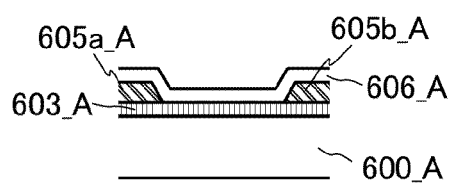

Next, as illustrated in FIG. 5C, the insulating layer 606_A is formed by formation of a first insulating film over the semiconductor layer 603_A, the conductive layer 605a_A, and the conductive layer 605b_A. The first insulating film can be formed by stacking films formed using materials that can be used for the insulating layer 606_A.

For example, the first insulating film can be formed by formation of a film formed using a material that can be used for the insulating layer 606_A by sputtering, plasma-enhanced CVD, or the like. Further, when the film formed using a material that can be used for the insulating layer 606_A is formed by high-density plasma-enhanced CVD (e.g., high-density plasma-enhanced CVD using microwaves (e.g., microwaves with a frequency of 2.45 GHz)), the insulating layer 606_A can be dense and can have higher breakdown voltage.

Figure 5D:
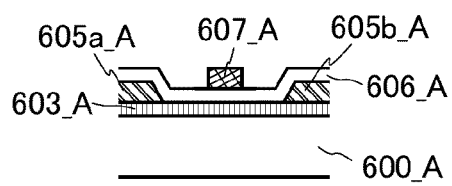

Then, as illustrated in FIG. 5D, a second conductive film is formed over the insulating layer 606_A and is partly etched, so that the conductive layer 607_A is formed.

For example, the second conductive film can be formed by formation of a film formed using a material that can be used for the conductive layer 607_A by sputtering. Alternatively, the second conductive film can be formed by stacking films formed using materials that can be used for the second conductive film.

Note that when a high-purity gas from which an impurity such as hydrogen, water, a hydroxyl group, or hydride is removed is used as a sputtering gas, for example, the impurity concentration in the film can be lowered.

Note that heat treatment (also referred to as heat treatment B) may be performed in a preheating chamber of a sputtering apparatus before the film is formed by sputtering. By the heat treatment B, an impurity such as hydrogen or moisture can be eliminated.

Before the film is formed by sputtering, for example, treatment in which voltage is applied not to a target side but to a substrate side in an argon, nitrogen, helium, or oxygen atmosphere with the use of an RF power and plasma is generated so that a surface on which the film is formed is modified (such treatment is also referred to as reverse sputtering) may be performed. By reverse sputtering, powdery substances (also referred to as particles or dust) that attach onto the surface on which the film is formed can be removed.

In the case where the film is formed by sputtering, moisture remaining in a deposition chamber for the film can be removed by an adsorption vacuum pump or the like. A cryopump, an ion pump, a titanium sublimation pump, or the like can be used as the adsorption vacuum pump. Alternatively, moisture remaining in the deposition chamber can be removed by a turbo-molecular pump provided with a cold trap.

Further, after the insulating layer 606_A is formed, heat treatment (also referred to as heat treatment C) may be performed in an inert gas atmosphere or an oxygen gas atmosphere. At this time, the heat treatment C can be performed at higher than or equal to 200° C. and lower than or equal to 400° C., preferably higher than or equal to 250° C. and lower than or equal to 350° C., for example.

Figure 5E:
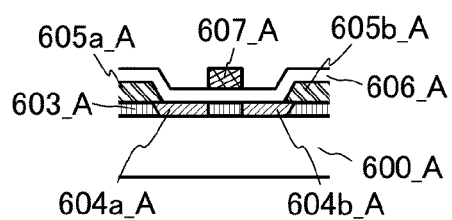

Then, as illustrated in FIG. 5E, a dopant is added to the semiconductor layer 603_A through the insulating layer 606_A from a side on which the conductive layer 607_A is formed, so that the region 604a_A and the region 604b_A are formed in a self-aligned manner.

For example, the dopant can be added with the use of an ion doping apparatus or an ion implantation apparatus.

As the dopant to be added, for example, one or more elements selected from elements belonging to Group 15 of the periodic table (e.g., one or more of nitrogen, phosphorus, and arsenic) and rare gas elements (e.g., one or more of helium, argon, and xenon) can be used.

As one of the methods for forming a region serving as a source region or a drain region by a self-aligned process in a transistor which includes an oxide semiconductor layer serving as a channel formation layer, a method has been disclosed in which a surface of an oxide semiconductor layer is exposed, argon plasma treatment is performed, and the resistivity of a region of the oxide semiconductor layer that is exposed to the plasma is reduced (S. Jeon et al., "180 nm Gate Length Amorphous InGaZnO Thin Film Transistor for High Density Image Sensor Applications", *IEDM Tech. Dig.*, 2010, p. 504).

However, in the above manufacturing method, for exposure of part of the oxide semiconductor layer which is to be the region serving as the source region or the drain region, an insulating layer serving as a gate insulating layer needs to be partly removed after being formed. Therefore, at the time of removal of the insulating layer serving as the gate insulating layer, the oxide semiconductor layer of a lower layer is also partly over-etched and the thickness of the part which is to be the region serving as the source region or the drain region is reduced. As a result, resistance of the part which is to be the region serving as the source region or the drain region is increased, and poor characteristics of a transistor due to overetching easily occur.

For miniaturization of the transistor, a dry etching method, which has high processing accuracy, needs to be employed. However, the above overetching tends to easily occur in the case of employing a dry etching method, in which selectivity of the insulating layer serving as the gate insulating layer to the oxide semiconductor layer cannot be sufficiently secured.

For example, when the oxide semiconductor layer has a sufficient thickness, overetching does not cause a problem; however, when a channel length is 200 nm or less, the thickness of part of the oxide semiconductor layer which is to be the channel formation region needs to be 20 nm or less, preferably 10 nm or less so that a short channel effect is prevented. In the case where such a thin oxide semiconductor layer is handled, overetching of the oxide semiconductor layer is unfavorable because such overetching causes an increase in resistance of the region serving as the source region or the drain region and poor characteristics of the transistor which are described above.

On the other hand, when the dopant is added to the oxide semiconductor layer while the oxide semiconductor layer is not exposed and the insulating layer as the gate insulating layer is not removed, as in one embodiment of the present invention, overetching of the oxide semiconductor layer can be prevented and excessive damage to the oxide semiconductor layer can be reduced. In addition, an interface between the oxide semiconductor layer and the insulating layer serving as the gate insulating layer is also kept clean. Thus, the characteristics and reliability of the transistor can be improved.

Note that heat treatment may be performed after the dopant is added to the semiconductor layer 603_A.

The above is description of an example of a method for manufacturing the transistor illustrated in FIG. 4A.

Note that although the example of the method for manufacturing the transistor illustrated in FIG. 4A is described, this embodiment is not limited to this example. For example, as for the components in FIGS. 4B to 4D that have the same designations as the components in FIG. 4A and whose functions are at least partly the same as those of the components in FIG. 4A, the description of the example of the method for manufacturing the transistor illustrated in FIG. 4A can be referred to as appropriate.

For example, in the case where the transistor illustrated in FIG. 4B is manufactured, after the step illustrated in FIG. 5D, a second insulating film is formed over the insulating layer 606_A and the conductive layer 607_A and is partly etched, so that the insulating layer 609a_A and the insulating layer 609b_A are formed; then, the dopant is added to the semiconductor layer 603_A, so that the dopant is added to part of the semiconductor layer 603_A through the insulating layer 609a_A and the insulating layer 609b_A, and the region 608a_A and the region 608b_A are formed. Note that the second insulating film may be formed by sequential formation of a plurality of insulating films.

As described above with reference to FIGS. 4A to 4D and FIGS. 5A to 5E, an example of the transistor in this embodiment includes a semiconductor layer in which a channel is formed, a conductive layer which is electrically connected to the semiconductor layer and serves as one of a source and a drain, a conductive layer which is electrically connected to the semiconductor layer and serves as the other of the source and the drain, an insulating layer serving as a gate insulating layer, and a conductive layer which overlaps with the semiconductor layer with the insulating layer interposed therebetween and serves as a gate.

Since the transistor in this embodiment has low off-state current, by employing the transistor as a transistor serving as a selection transistor in the memory cell in the memory circuit or semiconductor memory device of the above semiconductor device, a data retention period can be lengthened. Accordingly, the number of times of refresh operations can be reduced, which leads to a reduction in power consumption.

Further, in this embodiment, the oxide semiconductor layer serving as a channel formation layer includes a region to which a dopant is added and which has lower resistance than the channel formation region and serves as the source region or the drain region, whereby resistance between the channel formation region and the source or drain of the transistor can be low even when the area of the transistor is small.

Further, in this embodiment, a structure is employed in which the conductive layer serving as the gate and the conductive layer serving as the source or the drain do not overlap with each other, whereby parasitic capacitance between the gate and the source or the drain of the transistor can be reduced. Thus, a reduction in operating speed can be suppressed even when the area of the transistor is made small.

Further, in this embodiment, deterioration of the transistor due to light can be suppressed by employing a transistor including an oxide semiconductor layer in which at least a channel formation region is non-single-crystal and includes a phase which has a triangular, hexagonal, regular triangular, or regular hexagonal atomic arrangement when seen from the direction perpendicular to the a-b plane and in which metal atoms are arranged in a layered manner when seen from the direction perpendicular to the c-axis direction or metal atoms and oxygen atoms are arranged in a layered manner when seen from the direction perpendicular to the c-axis direction.

Embodiment 4

In this embodiment, an oxide including CAAC is described.

In a broad sense, an oxide including CAAC means a non-single-crystal oxide including a phase that has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 13A to 13E, FIGS. 14A to 14C, and FIGS. 15A to 15C. In FIGS. 13A to 13E, FIGS. 14A to 14C, and FIGS. 15A to 15C, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane).

Figure 13A:
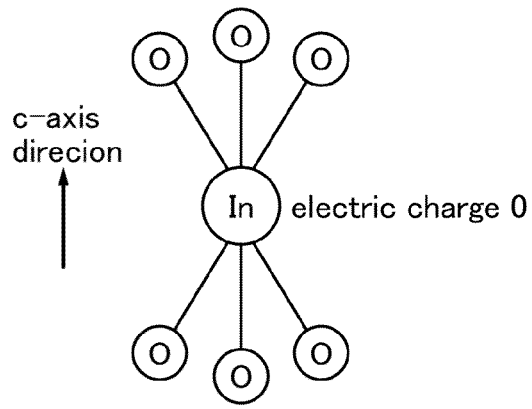
FIGS. 13A to 13E each illustrate a structure of an oxide material according to one embodiment of the present invention.

FIG. 13A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 13A is actually an octahedral structure, but is illustrated as a planar structure for simplicity. Note that three tetracoordinate O atoms exist in each of an upper half and a lower half in FIG. 13A. In the small group illustrated in FIG. 13A, electric charge is 0.

Figure 13D:
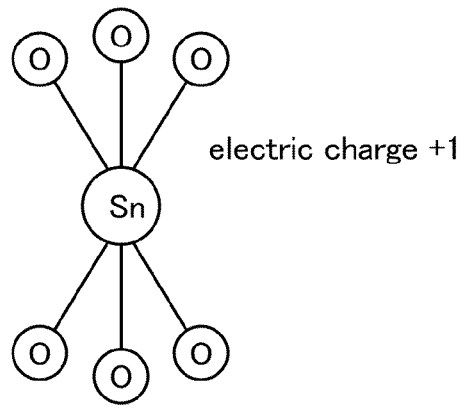
Figure 13B:
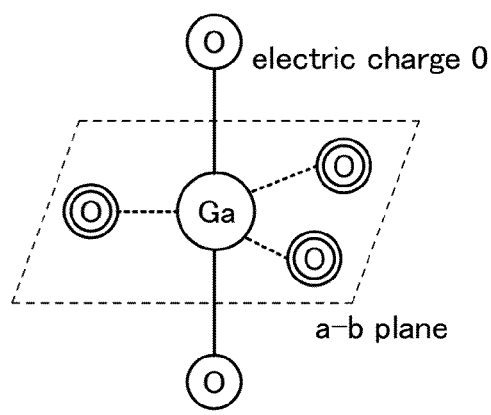

FIG. 13B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 13B. An In atom can also have the structure illustrated in FIG. 13B because an In atom can have five ligands. In the small group illustrated in FIG. 13B, electric charge is 0.

Figure 13E:
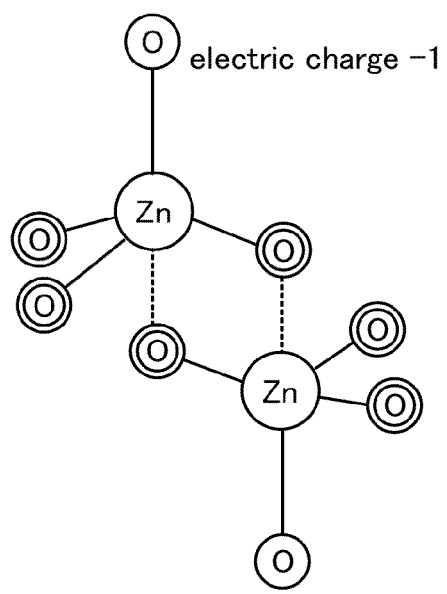
Figure 13C:
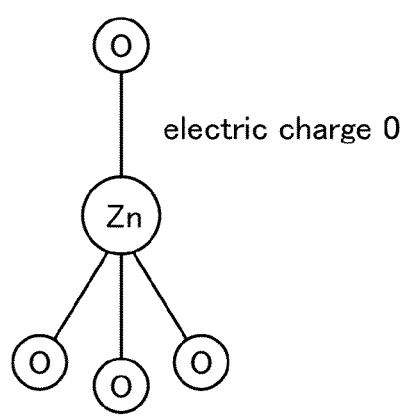

FIG. 13C illustrates a structure including one tetracoordinate Zn atom and four tetracoordinate O atoms proximate to the Zn atom. In FIG. 13C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 13C. In the small group illustrated in FIG. 13C, electric charge is 0.

FIG. 13D illustrates a structure including one hexacoordinate Sn atom and six tetracoordinate O atoms proximate to the Sn atom. In FIG. 13D, three tetracoordinate O atoms exist in each of an upper half and a lower half. In the small group illustrated in FIG. 13D, electric charge is +1.

FIG. 13E illustrates a small group including two Zn atoms. In FIG. 13E, one tetracoordinate O atom exists in each of an upper half and a lower half. In the small group illustrated in FIG. 13E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 13A each have three proximate In atoms in the downward direction, and the three O atoms in the lower half each have three proximate In atoms in the upward direction. The one O atom in the upper half with respect to the pentacoordinate Ga atom in FIG. 13B has one proximate Ga atom in the downward direction, and the one O atom in the lower half has one proximate Ga atom in the upward direction. The one O atom in the upper half with respect to the tetracoordinate Zn atom in FIG. 13C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total electric charge of the layered structure is 0.

FIG. 14A illustrates a model of a medium group included in a layered structure of an In—Sn—Zn—O-based material. FIG. 14B illustrates a large group including three medium groups. FIG. 14C illustrates an atomic arrangement in the case where the layered structure in FIG. 14B is observed from the c-axis direction.

In FIG. 14A, for simplicity, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 14A, one tetracoordinate O atom existing in each of an upper half and a lower half with respect to an In atom is denoted by circled 1. FIG. 14A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 14A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 13E can be given. For example, with one small group including two Zn atoms, electric charge of one small group including a Sn atom can be cancelled, so that the total electric charge of the layered structure can be 0.

When the large group illustrated in FIG. 14B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number). As larger m is, the crystallinity of the In—Sn—Zn—O-based crystal is improved, which is preferable.

The above-described rule also applies to the following oxides: a four-component metal oxide, such as an In—Sn—Ga—Zn-based oxide; a three-component metal oxide, such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Pm—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide, such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a single-component metal oxide, such as an In-based oxide, a Sn-based oxide, or a Zn-based oxide; and the like.

Figure 15A:
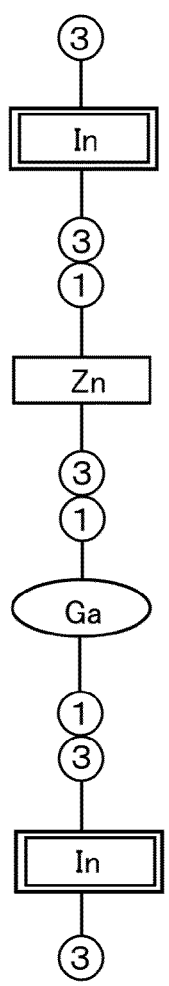
FIGS. 15A to 15C illustrate a structure of an oxide material according to one embodiment of the present invention.

As an example, FIG. 15A illustrates a model of a medium group included in a layered structure of an In—Ga—Zn—O-based material.

In the medium group included in the layered structure of the In—Ga—Zn—O-based material in FIG. 15A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 15B:
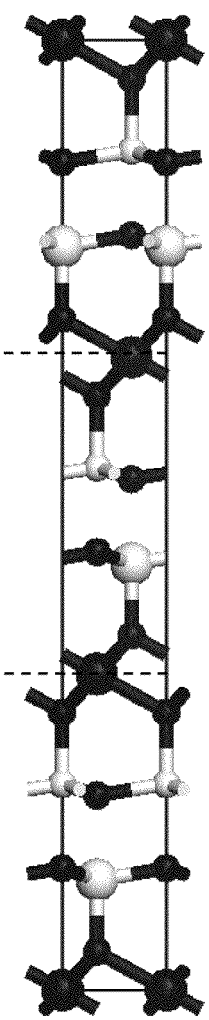
Figure 15C:
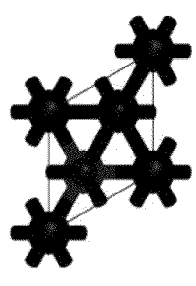

FIG. 15B illustrates a large group including three medium groups. FIG. 15C illustrates an atomic arrangement in the case where the layered structure in FIG. 15B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 15A but also a medium group in which the arrangement of the In atom, the Ga atom, and the Zn atom is different from that in FIG. 15A.

Embodiment 5

Figure 6:
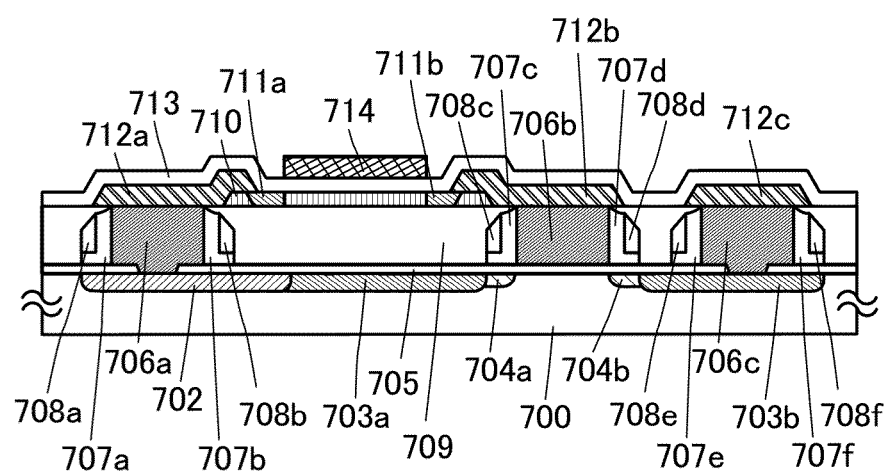
FIG. 6 is a cross-sectional schematic view illustrating an example of a structure of a memory cell.

In this embodiment, an example of a structure of a memory cell in the semiconductor memory device in Embodiment 2 is described with reference to FIG. 6. FIG. 6 is a cross-sectional schematic view illustrating an example of a structure of the memory cell in this embodiment. An example of a structure of a memory cell that has the structure illustrated in FIGS. 3A to 3C is described here as an example. Note that the components illustrated in FIG. 6 include those having sizes different from the actual sizes.

The memory cell illustrated in FIG. 6 includes a semiconductor layer 700, an insulating layer 705, conductive layers 706a, 706b, and 706c, insulating layers 707a, 707b, 707c, 707d, 707e, and 707f, insulating layers 708a, 708b, 708c, 708d, 708e, and 708f, an insulating layer 709, a semiconductor layer 710, conductive layers 712a, 712b, and 712c, an insulating layer 713, and a conductive layer 714.

The semiconductor layer 700 includes regions 702, 703a, 703b, 704a, and 704b.

As the semiconductor layer 700, for example, a semiconductor substrate can be used. Alternatively, a semiconductor layer provided over a different substrate can be used as the semiconductor layer 700.

Note that in a region of the semiconductor layer 700 which is between a plurality of memory cells, an insulating separation region may be provided.

The region 702 is a region to which a dopant imparting one of n-type conductivity and p-type conductivity is added.

The region 703a and the region 703b are regions which are separated from each other and to which a dopant imparting the other of the n-type conductivity and the p-type conductivity is added. The region 703a and the region 703b serve as a source region and a drain region of an output transistor in the memory cell.

Note that a diode in the memory cell is formed with the region 702 and the region 703a. The present invention is not limited thereto and a diode-connected transistor may be separately formed as a rectifier element.

The region 704a and the region 704b are provided between the region 703a and the region 703b so as to be separated from each other, and a channel formation region is formed between the region 704a and the region 704b. The region 704a is in contact with the region 703a, and the region 704b is in contact with the region 703b.

As in the region 703a and the region 703b, the region 704a and the region 704b are regions to which a dopant imparting the other of the n-type conductivity and the p-type conductivity is added.

Note that the concentration of the dopant of the region 704a and the region 704b may be lower than the concentration of the dopant of the region 703a and the region 703b. In that case, the region 704a and the region 704b are also referred to as low concentration regions. Further, in that case, the region 703a and the region 703b may be referred to as high concentration regions. The region 704a and the region 704b may have a shallower depth than the region 703a and the region 703b; however, the present invention is not limited thereto.

The insulating layer 705 is provided over the semiconductor layer 700. The insulating layer 705 serves as a gate insulating layer of the output transistor in the memory cell.

As the insulating layer 705, for example, a layer of a material such as silicon oxide, silicon nitride, silicon oxynitride, silicon nitride oxide, aluminum oxide, aluminum nitride, aluminum oxynitride, aluminum nitride oxide, hafnium oxide, or an organic insulating material (e.g., polyimide or acrylic) can be used. The insulating layer 705 may be formed by stacking layers formed using materials that can be used for the insulating layer 705.

The conductive layer 706a is provided over the insulating layer 705 and is electrically connected to the region 702 through a first opening portion penetrating the insulating layer 705.

The conductive layer 706b overlaps with the semiconductor layer 700 with the insulating layer 705 interposed therebetween. A region of the semiconductor layer 700, which overlaps with the conductive layer 706b serves as the channel formation region of the output transistor in the memory cell. The conductive layer 706b serves as a gate of the output transistor in the memory cell.

The conductive layer 706c is provided over the insulating layer 705 and is electrically connected to the region 703b through a second opening portion penetrating the insulating layer 705.

The insulating layer 707a is provided over the insulating layer 705 and is in contact with one of a pair of side surfaces of the conductive layer 706a which face each other.

The insulating layer 707b is provided over the insulating layer 705 and is in contact with the other of the pair of side surfaces of the conductive layer 706a which face each other.

The insulating layer 707c is provided over the insulating layer 705 and is in contact with one of a pair of side surfaces of the conductive layer 706b which face each other. Further, the insulating layer 707c overlaps with the region 704a with the insulating layer 705 interposed therebetween.

The insulating layer 707d is provided over the insulating layer 705 and is in contact with the other of the pair of side surfaces of the conductive layer 706b which face each other. Further, the insulating layer 707d overlaps with the region 704b with the insulating layer 705 interposed therebetween.

The insulating layer 707e is provided over the insulating layer 705 and is in contact with one of a pair of side surfaces of the conductive layer 706c which face each other.

The insulating layer 707f is provided over the insulating layer 705 and is in contact with the other of the pair of side surfaces of the conductive layer 706c which face each other.

The insulating layer 708a is provided over the insulating layer 707a.

The insulating layer 708b is provided over the insulating layer 707b.

The insulating layer 708c is provided over the insulating layer 707c.

The insulating layer 708d is provided over the insulating layer 707d.

The insulating layer 708e is provided over the insulating layer 707e.

The insulating layer 708f is provided over the insulating layer 707f.

The insulating layer 709 is provided over the insulating layer 705.

The semiconductor layer 710 is provided over the insulating layer 709. The semiconductor layer 710 includes a region 711a and a region 711b.

As the semiconductor layer 710, for example, a layer formed using a material that can be used for the semiconductor layer 603_A of the transistor described in Embodiment 3 with reference to FIG. 4A can be used. The semiconductor layer 710 serves as a channel formation layer of a transistor that serves as a selection transistor in the memory cell.

The region 711a and the region 711b are regions to which a dopant imparting n-type conductivity is added. For the region 711a and the region 711b, a dopant which can be used as the dopant added to the region 604a_A and the region 604b_A of the transistor that is described in Embodiment 3 with reference to FIG. 4A can be used. The concentration of the dopant of the region 711a and the region 711b can be set within the range of the concentration of the dopant which can be employed for the region 604a_A and the region 604b_A.

The region 711a and the region 711b are provided so as to be separated from each other. A channel formation region is formed between the region 711a and the region 711b.

The conductive layer 712a is electrically connected to the conductive layer 706a and the semiconductor layer 710. Further, part of the conductive layer 712a overlaps with the region 711a. The conductive layer 712a serves as one of a source and a drain of the transistor that serves as the selection transistor in the memory cell.

The conductive layer 712b is electrically connected to the conductive layer 706b and the semiconductor layer 710. Further, part of the conductive layer 712b overlaps with the region 711b. The conductive layer 712b serves as the other of the source and the drain of the transistor that serves as the selection transistor in the memory cell.

The conductive layer 712c is electrically connected to the conductive layer 706c.

As the conductive layers 712a to 712c, for example, a layer formed using a material that can be used for the conductive layer 605a_A and the conductive layer 605b_A of the transistor described in Embodiment 3 with reference to FIG. 4A can be used.

The insulating layer 713 is provided over the semiconductor layer 710. The insulating layer 713 serves as a gate insulating layer of the selection transistor in the memory cell.

As the insulating layer 713, for example, a layer formed using a material that can be used for the insulating layer 606_A of the transistor described in Embodiment 3 with reference to FIG. 4A can be used.

The conductive layer 714 overlaps with the semiconductor layer 710 with the insulating layer 713 interposed therebetween. The conductive layer 714 serves as a gate of the transistor which serves as the selection transistor in the memory cell.

As the conductive layer 714, for example, a layer formed using a material that can be used for the conductive layer 607_A of the transistor described in Embodiment 3 with reference to FIG. 4A can be used.

The above is description of an example of a structure of the memory cell illustrated in FIG. 6.

In this embodiment, the area of a memory cell can be made small by employing a stack of a plurality of transistors.

In addition, in this embodiment, a transistor serving as an output transistor in the memory cell includes a semiconductor layer which contains a semiconductor belonging to Group 14 (e.g., silicon) and has high current supply capability, and a transistor serving as a selection transistor in the memory cell includes an oxide semiconductor layer and has low off-state current; accordingly, operating speed of the memory cell can be high and a data retention period can be lengthened. Thus, power consumption can be reduced.

Furthermore, in this embodiment, the oxide semiconductor layer which is included in the transistor serving as the selection transistor includes a region to which a dopant is added, whereby resistance between a channel formation region and a source or a drain can be low even when the area of the memory cell is small.

Embodiment 6

In this embodiment, the field-effect mobility of a transistor will be described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \qquad \text{[Formula 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[Formula 3]}$$

Here, e represents the elementary charge, N represents the average defect density per unit area in a channel, $\varepsilon$ represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is 30 nm or less, the thickness of the channel may be regarded as being the same as the thickness of the semiconductor layer. The drain current $I_d$ in a linear region can be expressed as the following formula.

$$I_d = \frac{W\mu V_g V_d C_{ox}}{L} \exp\left(-\frac{E}{kT}\right) \quad \text{[Formula 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W\mu V_d C_{ox}}{L}\right) - \frac{E}{kT} \quad \text{[Formula 5]}$$
$$= \ln\left(\frac{W\mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm²/Vs from Formula 2 and Formula 3. The measured mobility of an In—Sn—Zn-based oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{G}\right) \quad \text{[Formula 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 16:
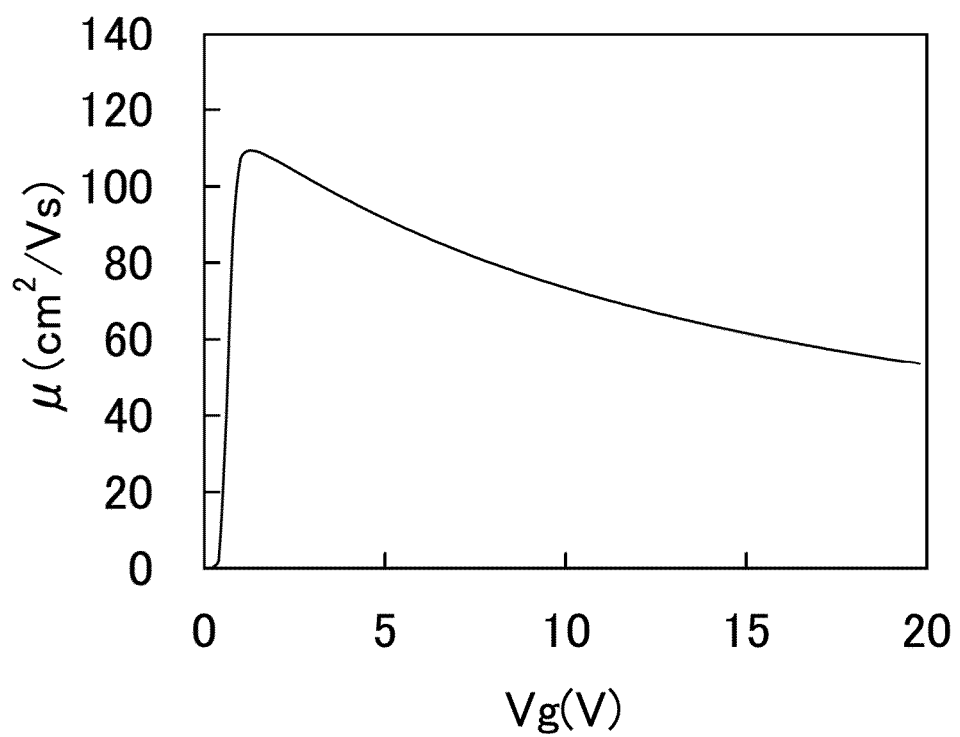
FIG. 16 shows gate voltage dependence of mobility obtained by calculation.

Calculation results of the mobility $\mu_2$ of a transistor whose channel includes an ideal oxide semiconductor without a defect inside the semiconductor are shown in FIG. 16. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by sputtering.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 16, the mobility has a peak of 100 cm²/Vs or more at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 17A to 17C, FIGS. 18A to 18C, and FIGS. 19A to 19C. FIGS. 20A and 20B illustrate cross-sectional structures of the transistors used for the calculation. The transistors illustrated in FIGS. 20A and 20B each include a semiconductor region 903a and a semiconductor region 903c which have n⁺-type conductivity in an oxide semiconductor layer. The resistivities of the semiconductor region 903a and the semiconductor region 903c are $2 \times 10^{-3}$ Ωcm.

The transistor illustrated in FIG. 20A is formed over a base insulating film 901 and an embedded insulator 902 which is embedded in the base insulating film 901 and formed of aluminum oxide. The transistor includes the semiconductor region 903a, the semiconductor region 903c, an intrinsic semiconductor region 903b serving as a channel formation region therebetween, and a gate electrode 905. The width of the gate electrode 905 is 33 nm.

A gate insulating layer 904 is formed between the gate electrode 905 and the semiconductor region 903b. In addition, a sidewall insulator 906a and a sidewall insulator 906b are formed on both side surfaces of the gate electrode 905, and an insulator 907 is formed over the gate electrode 905 so as to prevent a short circuit between the gate electrode 905 and another wiring. The sidewall insulator has a width of 5 nm. A source electrode 908a and a drain electrode 908b are provided in contact with the semiconductor region 903a and the semiconductor region 903c, respectively. Note that the channel width of this transistor is 40 nm.

The transistor of FIG. 20B is the same as the transistor of FIG. 20A in that it is formed over the base insulating film 901 and the embedded insulator 902 formed of aluminum oxide and that it includes the semiconductor region 903a, the semiconductor region 903c, the intrinsic semiconductor region 903b provided therebetween, the gate electrode 905 having a width of 33 nm, the gate insulating layer 904, the sidewall insulator 906a, the sidewall insulator 906b, the insulator 907, the source electrode 908a, and the drain electrode 908b.

The transistor illustrated in FIG. 20B is different from the transistor illustrated in FIG. 20A in the conductivity type of semiconductor regions under the sidewall insulator 906a and the sidewall insulator 906b. In the transistor illustrated in FIG. 20A, the semiconductor regions under the sidewall insulator 906a and the sidewall insulator 906b are part of the semiconductor region 903a having n⁺-type conductivity and part of the semiconductor region 903c having n⁺-type conductivity, whereas in the transistor illustrated in FIG. 20B, the semiconductor regions under the sidewall insulator 906a and the sidewall insulator 906b are part of the intrinsic semiconductor region 903b. In other words, a region having a width of $L_{off}$ which overlaps with neither the semiconductor region 903a (the semiconductor region 903c) nor the gate electrode 905 is provided. This region is called an offset region, and the width $L_{off}$ is called an offset length. As is seen from the drawing, the offset length is equal to the width of the sidewall insulator 906a (the sidewall insulator 906b).

Figure 17A:
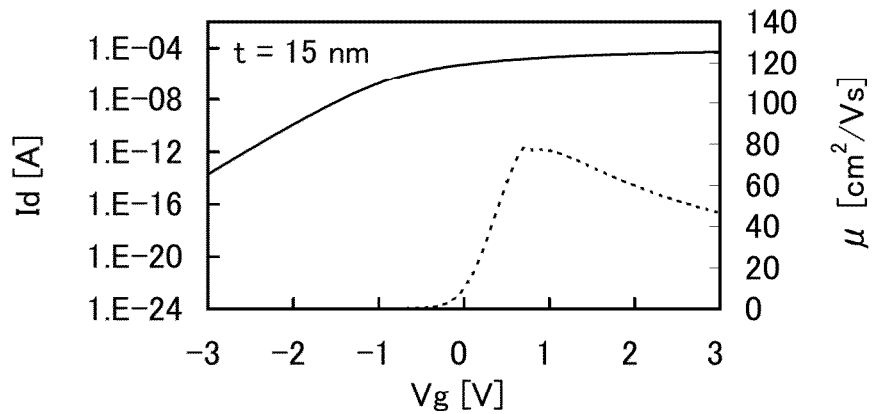
FIGS. 17A to 17C each show gate voltage dependence of drain current and mobility of a transistor, which is obtained by calculation.
Figure 17B:
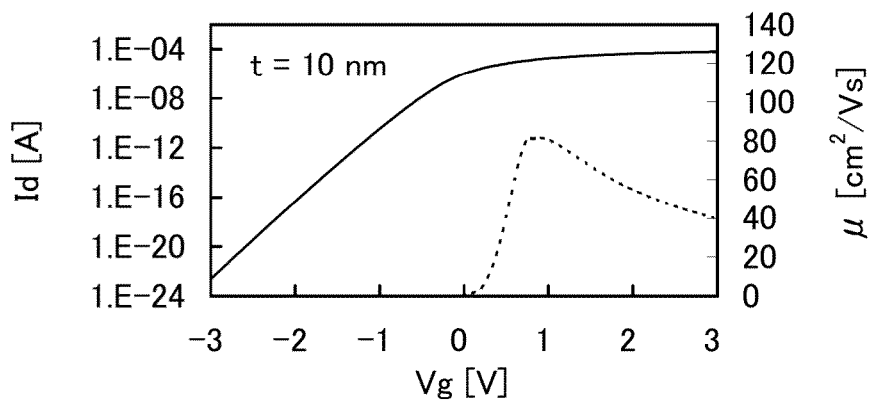
Figure 17C:
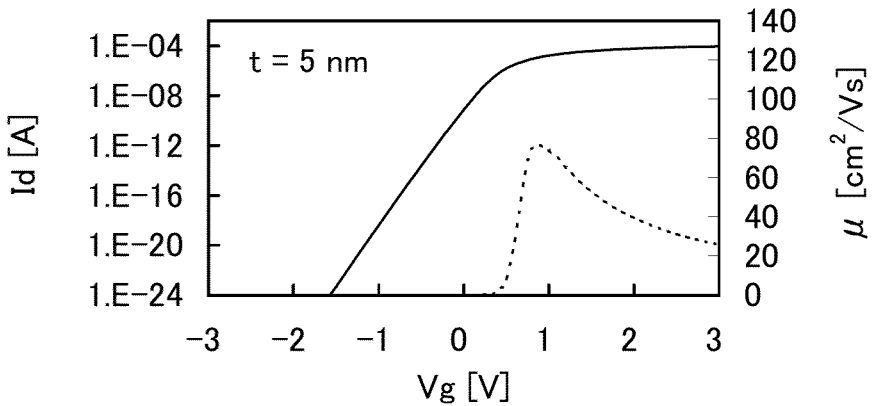

The other parameters used in calculation are as described above. For the calculation, device simulation software Sentaurus Device manufactured by Synopsys, Inc. was used. FIGS. 17A to 17C show the gate voltage ($V_g$: a potential difference between the gate and the source) dependence of the drain current ($I_d$, a solid line) and the mobility ($\mu$, a dotted line) of the transistor having the structure illustrated in FIG. 20A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 17A shows the gate voltage dependence of the transistor in the case where the thickness of the gate insulating layer is 15 nm, FIG. 17B shows that of the transistor in the case where the thickness of the gate insulating layer is 10 nm, and FIG. 17C shows that of the transistor in the case where the thickness of the gate insulating layer is 5 nm As the gate insulating layer is thinner, the drain current $I_d$ (off-state current) particularly in an off state is significantly decreased. In contrast, there is no noticeable change in the peak value of the mobility $\mu$ and the drain current $I_d$ in an on state (on-state current). The graphs show that the drain current exceeds 10 μA at a gate voltage of around 1 V.

Figure 18A:
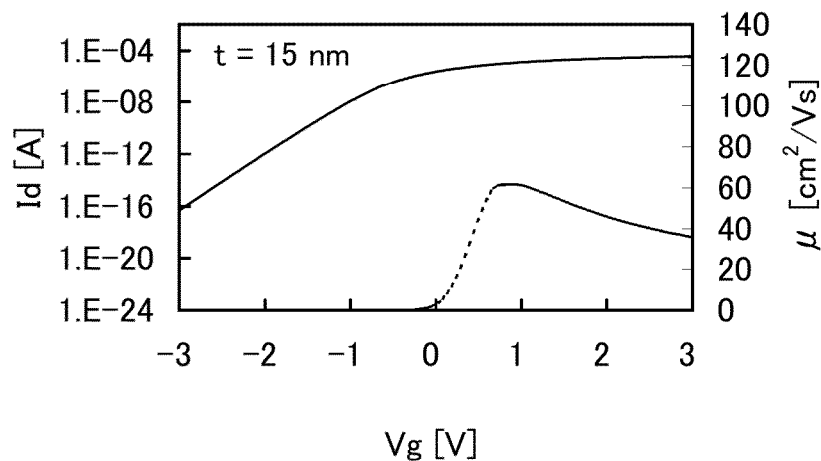
FIGS. 18A to 18C each show gate voltage dependence of drain current and mobility of a transistor, which is obtained by calculation.
Figure 18B:
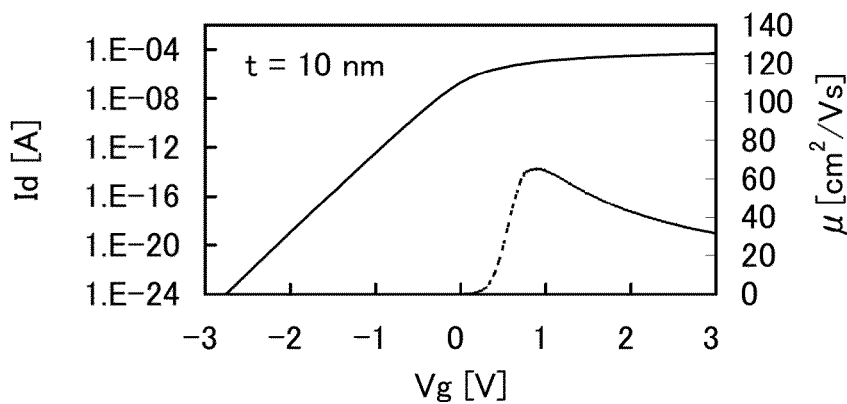
Figure 18C:
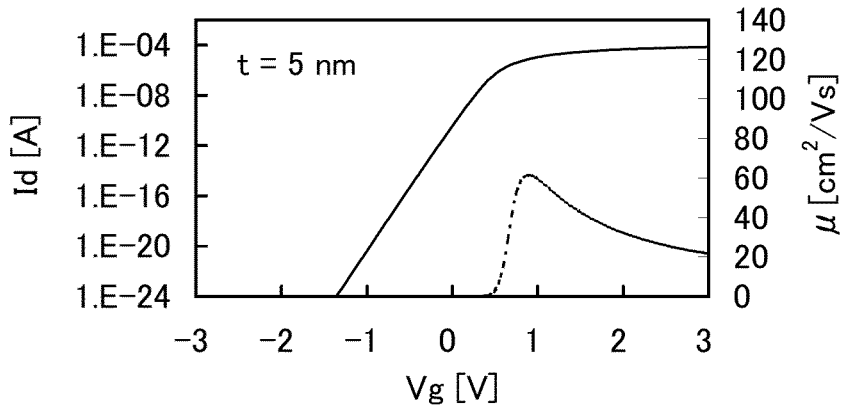

FIGS. 18A to 18C show the gate voltage $V_g$ dependence of the drain current $I_d$ (a solid line) and the mobility $\mu$ (a dotted line) of the transistor having the structure illustrated in FIG. 20B where the offset length $L_{off}$ is 5 nm. The drain current $I_d$ is obtained by calculation under the assumption that the drain voltage is +1 V and the mobility $\mu$ is obtained by calculation under the assumption that the drain voltage is +0.1 V. FIG. 18A shows the gate voltage dependence of the transistor in the case where the thickness of the gate insulating layer is 15 nm, FIG. 18B shows that of the transistor in the case where the thickness of the gate insulating layer is 10 nm, and FIG. 18C shows that of the transistor in the case where the thickness of the gate insulating layer is 5 nm.

Figure 19A:
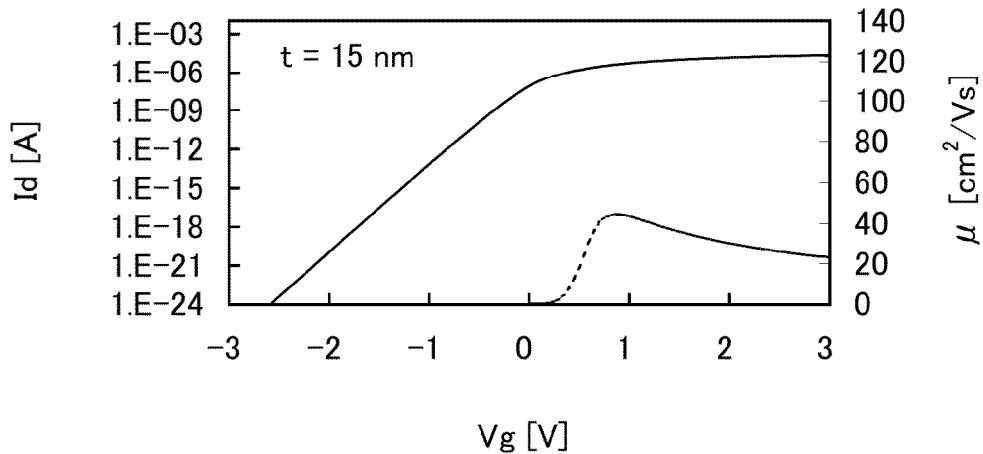
FIGS. 19A to 19C each show gate voltage dependence of drain current and mobility of a transistor, which is obtained by calculation.
Figure 19B:
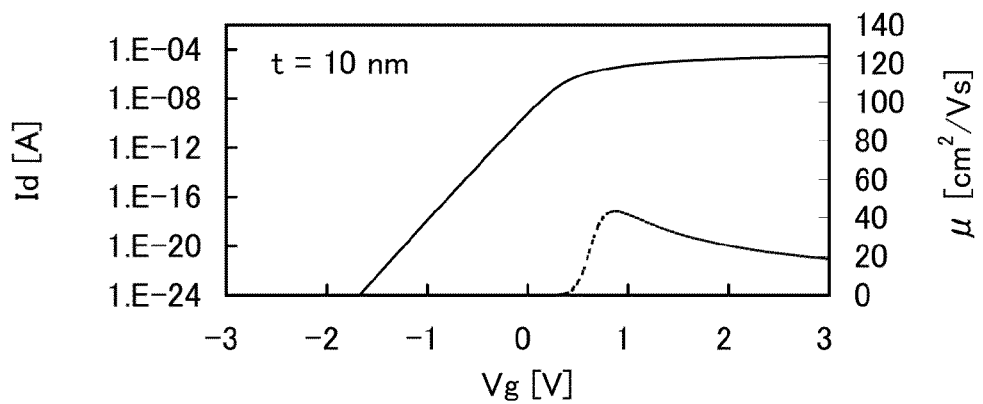
Figure 19C:
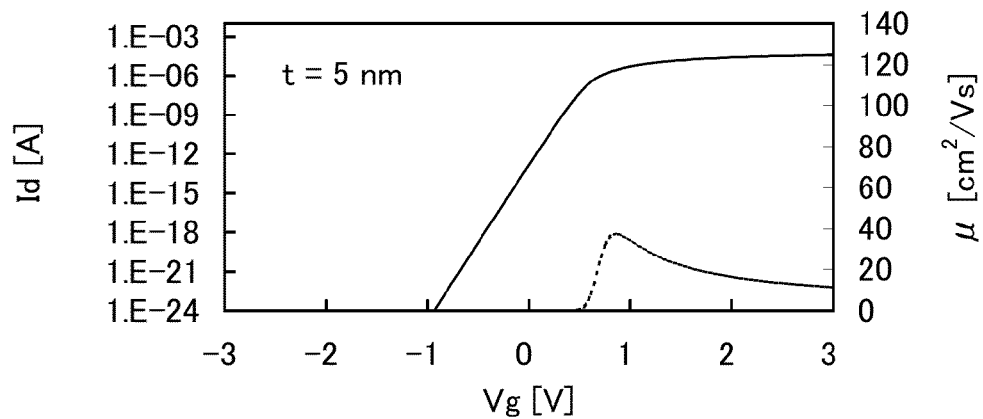
Figure 20A:
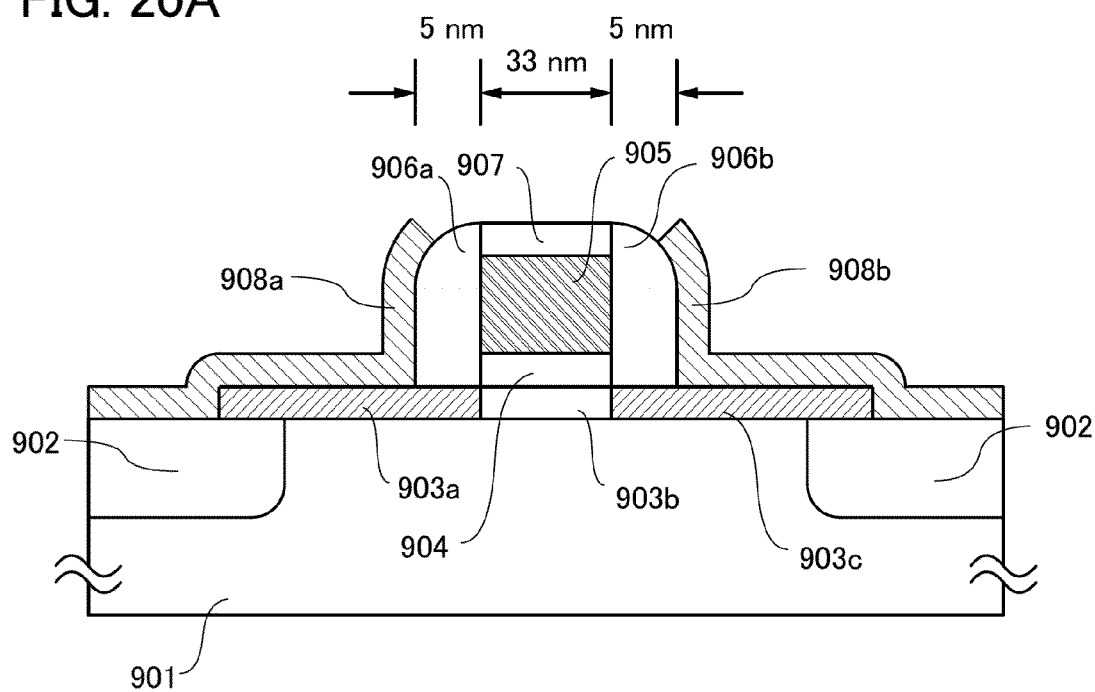
FIGS. 20A and 20B each illustrate a cross-sectional structure of a transistor used for calculation.
Figure 20B:
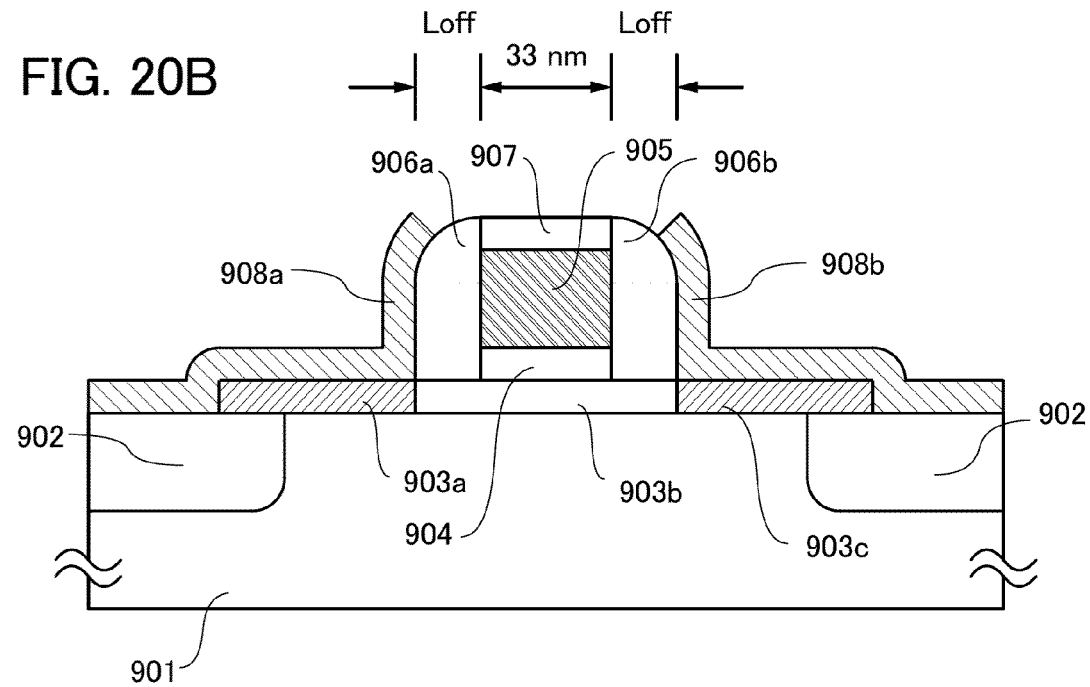

Further, FIGS. 19A to 19C show the gate voltage dependence of the drain current $I_d$ (a solid line) and the mobility $\mu$ (a dotted line) of the transistor having the structure illustrated in FIG. 20B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 19A shows the gate voltage dependence of the transistor in the case where the thickness of the gate insulating layer is 15 nm, FIG. 19B shows that of the transistor in the case where the thickness of the gate insulating layer is 10 nm, and FIG. 19C shows that of the transistor in the case where the thickness of the gate insulating layer is 5 nm.

In either of the structures, as the gate insulating layer is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 17A to 17C, approximately 60 cm$^2$/Vs in FIGS. 18A to 18C, and approximately 40 cm$^2$/Vs in FIGS. 19A to 19C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA at a gate voltage of around 1 V.

Embodiment 7

In this embodiment, an example of a structure of a semiconductor memory device is described.

Figure 7:
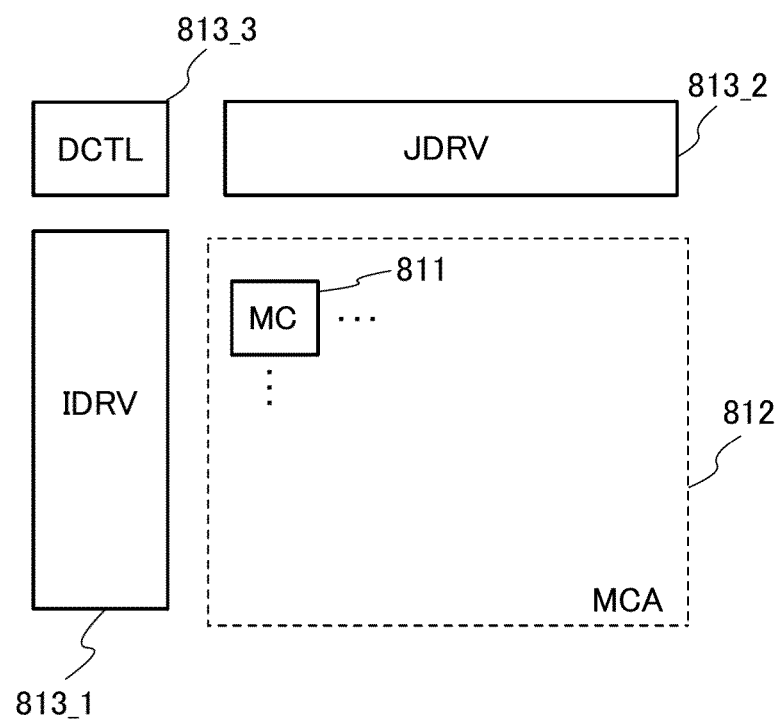
FIG. 7 is a block diagram illustrating an example of a structure of a semiconductor memory device.

First, an example of a structure of a semiconductor memory device in this embodiment is described with reference to FIG. 7. FIG. 7 is a block diagram illustrating an example of a structure of the semiconductor memory device in this embodiment.

The semiconductor memory device illustrated in FIG. 7 includes a memory cell array (also referred to as MCA) 812 including a plurality of memory cells (also referred to as MC) 811, a first driver circuit (also referred to as IDRV) 813_1, a second driver circuit (also referred to as JDRV) 813_2, and a drive control circuit (also referred to as DCTL) 813_3.

As the structure of the memory cell array, the structure of the memory cell array in the semiconductor memory device described in Embodiment 2 can be used.

A row address signal is input to the first driver circuit 813_1. The first driver circuit 813_1 selects a wiring arranged in a row direction in accordance with the row address signal input and sets the voltage of the wiring. The first driver circuit 813_1 includes a decoder, for example. The decoder selects the wiring in accordance with the row address signal input. Note that the semiconductor memory device in this embodiment may include a plurality of first driver circuits 813_1.

A data signal and a column address signal are input to the second driver circuit 813_2. The second driver circuit 813_2 sets the voltage of a wiring arranged in a column direction. The second driver circuit 813_2 includes a decoder, a plurality of analog switches, a read signal output circuit, and a read circuit, for example. The decoder selects the wiring. The plurality of analog switches determine whether or not the data signal is output in accordance with a signal input from the decoder. The read signal output circuit outputs a read signal to a wiring serving as a data line or a selection line. The read circuit reads data stored in the memory cell 811 which is electrically connected to a wiring selected by the read signal.

A write control signal, a read control signal, and an address signal are input to the drive control circuit 813_3. The drive control circuit 813_3 generates and outputs signals which control the operation of the first driver circuit 813_1 and the second driver circuit 813_2 in accordance with the input write control signal, read control signal, and address signal. For example, the drive control circuit 813_3 outputs a plurality of row address signals to the first driver circuit 813_1 and a plurality of column address signals to the second driver circuit 813_2 in accordance with the address signal.

As described with reference to FIG. 7, the example of the memory device in this embodiment includes a memory cell array including a plurality of memory cells, a first driver circuit (also referred to as IDRV), a second driver circuit (also referred to as JDRV), and a drive control circuit.

With such a structure, data can be written to and read from each memory cell.

Embodiment 8

In this embodiment, examples of electronic devices each including the semiconductor memory device in the above embodiment are described.

Examples of structures of electronic devices in this embodiment are described with reference to FIGS. 8A to 8D.

Figure 8A:
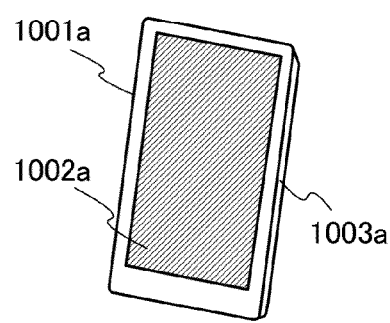
FIGS. 8A to 8D are schematic views each illustrating an example of an electronic device.

The electronic device illustrated in FIG. 8A is an example of a personal digital assistant. The personal digital assistant illustrated in FIG. 8A includes a housing 1001*a* and a display portion 1002*a* provided in the housing 1001*a*.

Note that a side surface 1003*a* of the housing 1001*a* may be provided with a connection terminal for connecting the personal digital assistant to an external device and/or a button for operating the personal digital assistant illustrated in FIG. 8A.

The personal digital assistant illustrated in FIG. 8A includes a CPU, a memory circuit, an interface for transmitting and receiving a signal between the external device and each of the CPU and the memory circuit, and an antenna for transmitting and receiving a signal to and from the external device, in the housing 1001*a*.

The personal digital assistant illustrated in FIG. 8A serves as one or more of a telephone set, an e-book reader, a personal computer, and a game machine, for example.

Figure 8C:
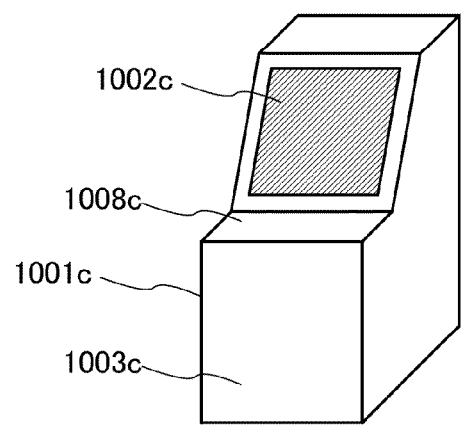
Figure 8B:
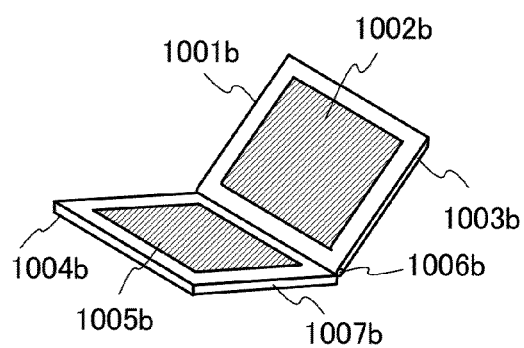

The electronic device illustrated in FIG. 8B is an example of a folding personal digital assistant. The personal digital assistant illustrated in FIG. 8B includes a housing 1001*b*, a display portion 1002*b* provided in the housing 1001*b*, a housing 1004*b*, a display portion 1005*b* provided in the housing 1004*b*, and a hinge 1006*b* for connecting the housing 1001*b* and the housing 1004*b*.

In the personal digital assistant illustrated in FIG. 8B, the housing 1001*b* can be stacked on the housing 1004*b* by moving the housing 1001*b* or the housing 1004*b* with the hinge 1006*b*.

Note that a side surface 1003*b* of the housing 1001*b* or a side surface 1007*b* of the housing 1004*b* may be provided with a connection terminal for connecting the personal digital assistant to an external device and/or a button for operating the personal digital assistant illustrated in FIG. 8B.

The display portion 1002*b* and the display portion 1005*b* may display different images or one image. Note that the display portion 1005*b* is not necessarily provided, and a keyboard which is an input device may be provided instead of the display portion 1005*b*.

The personal digital assistant illustrated in FIG. 8B includes a CPU, a memory circuit, and an interface for transmitting and receiving a signal between the external device and each of the CPU and the memory circuit in the housing 1001*b* or the housing 1004*b*. Note that the personal digital assistant illustrated in FIG. 8B may include an antenna for transmitting and receiving a signal to and from the external device.

The personal digital assistant illustrated in FIG. 8B serves as one or more of a telephone set, an e-book reader, a personal computer, and a game machine, for example.

The electronic device illustrated in FIG. 8C is an example of a stationary information terminal. The stationary information terminal illustrated in FIG. 8C includes a housing 1001*c* and a display portion 1002*c* provided in the housing 1001*c*.

Note that the display portion 1002*c* can be provided on a deck portion 1008*c* in the housing 1001*c*.

The stationary information terminal illustrated in FIG. 8C includes a CPU, a memory circuit, and an interface for transmitting and receiving a signal between the external device and each of the CPU and the memory circuit in the housing 1001*c*. Note that the stationary information terminal illustrated in FIG. 8C may include an antenna for transmitting and receiving a signal to and from the external device.

Further, a side surface 1003*c* of the housing 1001*c* in the stationary information terminal illustrated in FIG. 8C may be provided with one or more of a ticket output portion that outputs a ticket or the like, a coin slot, and a bill slot.

The stationary information terminal illustrated in FIG. 8C serves as an automated teller machine, an information communication terminal (also referred to as a multimedia station) for ordering a ticket or the like, or a game machine, for example.

Figure 8D:
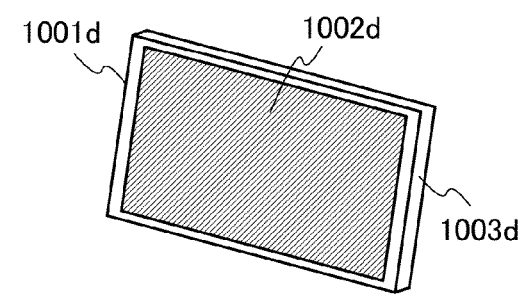

The electronic device illustrated in FIG. 8D is an example of a stationary information terminal. The stationary information terminal illustrated in FIG. 8D includes a housing 1001*d* and a display portion 1002*d* provided in the housing 1001*d*. Note that a support for supporting the housing 1001*d* may also be provided.

Note that a side surface 1003*d* of the housing 1001*d* may be provided with a connection terminal for connecting the stationary information terminal to an external device and/or a button for operating the stationary information terminal illustrated in FIG. 8D.

The stationary information terminal illustrated in FIG. 8D may include a CPU, a memory circuit, and an interface for transmitting and receiving a signal between the external device and each of the CPU and the memory circuit in the housing 1001*d*. Note that the stationary information terminal illustrated in FIG. 8D may include an antenna for transmitting and receiving a signal to and from the external device.

The stationary information terminal illustrated in FIG. 8D serves as a digital photo frame, a monitor, or a television set, for example.

The semiconductor memory device in the above embodiment is used as one memory circuit in an electronic device, for example. For example, the semiconductor memory device in the above embodiment is used as one of the memory circuits in the electronic devices illustrated in FIGS. 8A to 8D.

As described with reference to FIGS. 8A to 8D, the examples of the electronic devices in this embodiment each include a memory circuit which includes the semiconductor memory device in the above embodiment.

With such a structure, even when power is not supplied, data in an electronic device can be retained for a certain period. Thus, reliability can be improved and power consumption can be reduced.

Further, without limitation to the structures illustrated in FIGS. 8A to 8D, a portable semiconductor memory device or the like provided with a connector can be manufactured using the semiconductor memory device in the above embodiment.

A specific example is described below in which the semiconductor memory device in the above embodiment is applied to a portable device such as a personal digital assistant, a mobile phone, a smartphone, or an e-book reader.

In portable devices, SRAMs or DRAMs are used for temporary storage of image data, or the like.

The reason for using an SRAM or a DRAM is that a flash memory has low response speed and is unsuitable for image processing.

However, in the case of using an SRAM or a DRAM for temporary storage of image data, there is a problem described below.

Figure 9A:
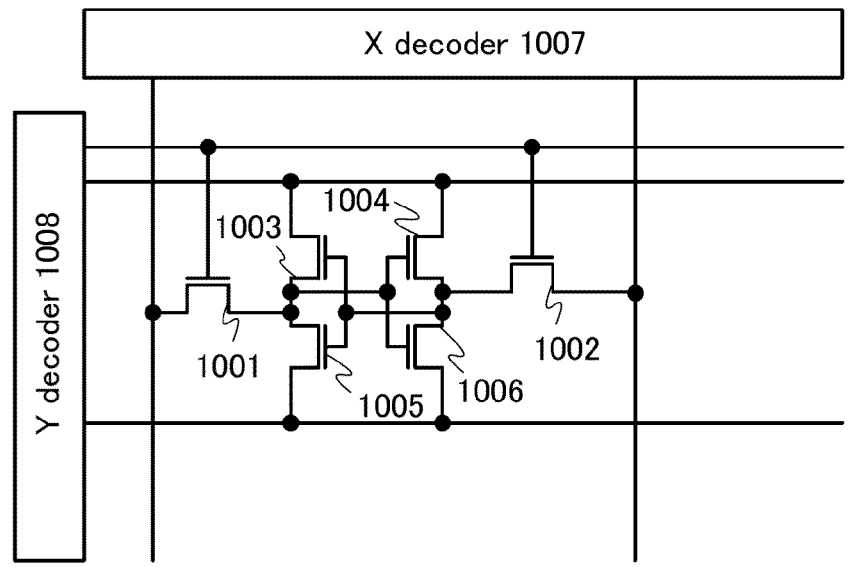
FIGS. 9A and 9B are circuit diagrams each illustrating an example of a structure of a conventional memory.

An SRAM has the advantage of a high response speed. In a usual SRAM, as illustrated in FIG. 9A, one memory cell includes six transistors 1001, 1002, 1003, 1004, 1005, and 1006, which are driven by an X decoder 1007 and a Y decoder 1008. Moreover, in the usual SRAM, high speed driving is made possible by a first inverter including the transistor 1003 and the transistor 1005 and a second inverter including the transistor 1004 and the transistor 1006.

However, the usual SRAM has the disadvantage of a large cell area because one memory cell is formed with six transistors. Provided that the minimum feature size of a design rule is F, the memory cell area of an SRAM is generally 100 $F^2$ to 150 F². Therefore, the SRAM has a problem in that a unit price per bit is the most expensive among memory devices.

Figure 9B:
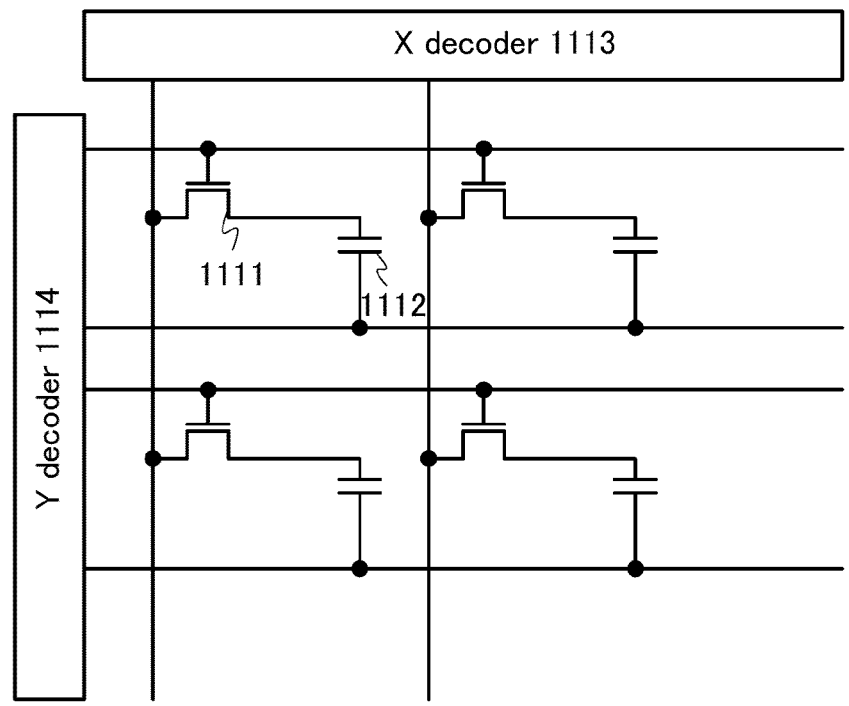

On the other hand, in a DRAM, as illustrated in FIG. 9B, one memory cell includes a transistor 1111 and a storage capacitor 1112, which are driven by an X decoder 1113 and a Y decoder 1114. One memory cell can be formed with one transistor and one capacitor, whereby the cell area is small. The memory cell area of the DRAM is usually 10 F² or less. However, the DRAM has a problem in that a refresh operation needs to be frequently performed and power is consumed even when different data is not rewritten.

Unlike the SRAM and the DRAM, the semiconductor memory device in the above embodiment has a memory cell area of approximately 10 F² and does not need frequent refresh operations.

With the use of the semiconductor memory device in the above embodiment, power consumption can be reduced while an increase in the area of a memory cell is suppressed; therefore, the above two problems can be solved.

Figure 10:
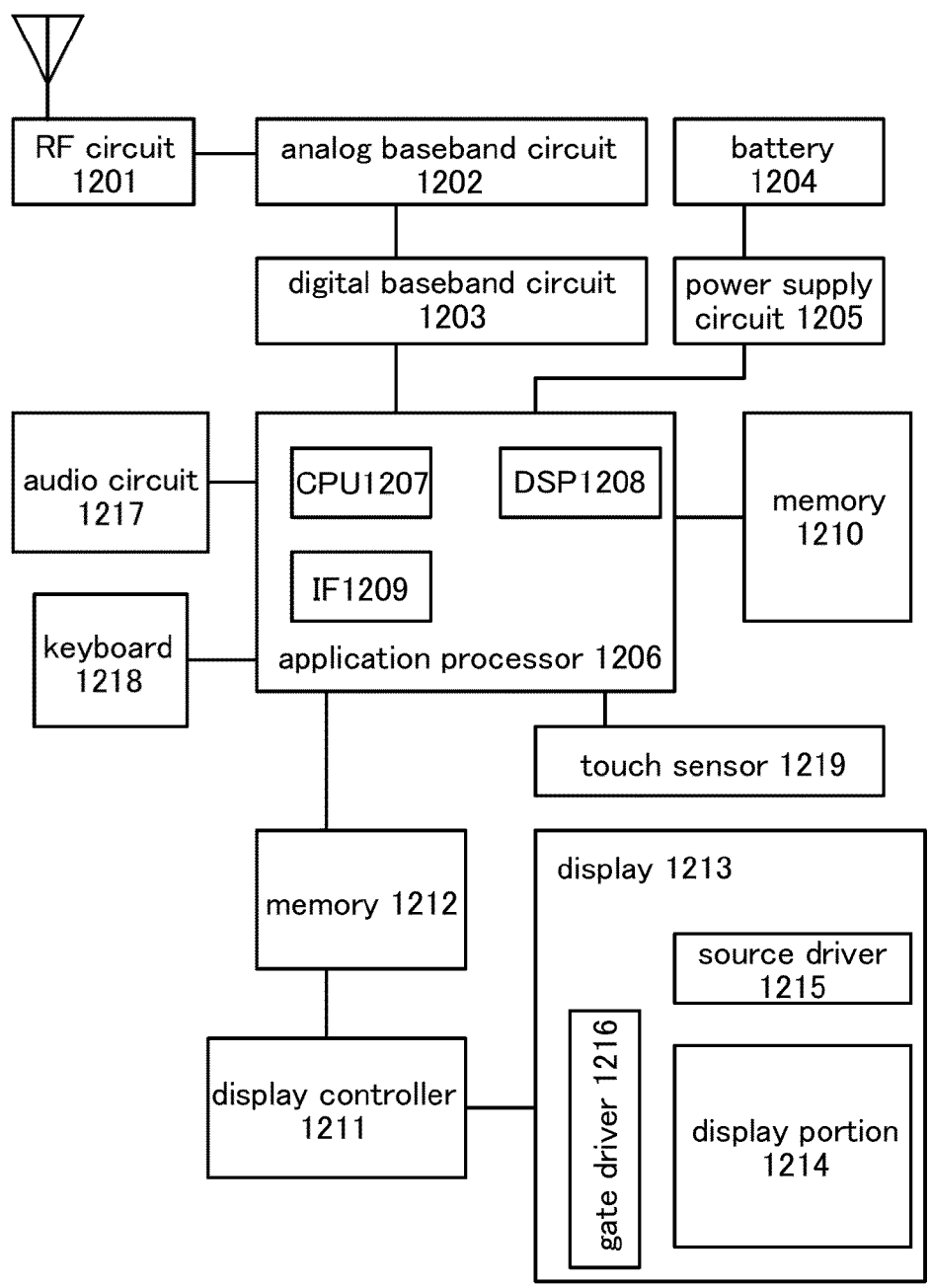
FIG. 10 is a block diagram illustrating an example of a structure of a mobile phone.

FIG. 10 is a block diagram illustrating an example of a portable device. The portable device illustrated in FIG. 10 includes, for example, a radio frequency (RF) circuit 1201, an analog baseband circuit 1202, a digital baseband circuit 1203, a battery 1204, a power supply circuit 1205, an application processor 1206, a memory 1210 that is a flash memory, a display controller 1211, a memory 1212, a display 1213, a touch sensor 1219, an audio circuit 1217 (such as a speaker or a microphone), a keyboard 1218 that is one of input means, and the like.

The RF circuit 1201 receives an electric wave including data, for example. For example, an antenna or the like is used as the RF circuit 1201.

By providing the touch sensor 1219, a display portion 1214 of the display 1213 can be operated.

The display 1213 includes the display portion 1214, a source driver 1215, and a gate driver 1216. Operation of the display portion 1214 is controlled by the source driver 1215 and the gate driver 1216.

The application processor 1206 includes a CPU 1207, a digital signal processor (also referred to as a DSP) 1208, and an interface (also referred to as an IF) 1209.

The memory 1212 usually includes an SRAM or a DRAM; however, when the semiconductor memory device in the above embodiment is used, a unit price per bit of a memory can be reduced and power consumption of the memory 1212 can be reduced.

Figure 11:
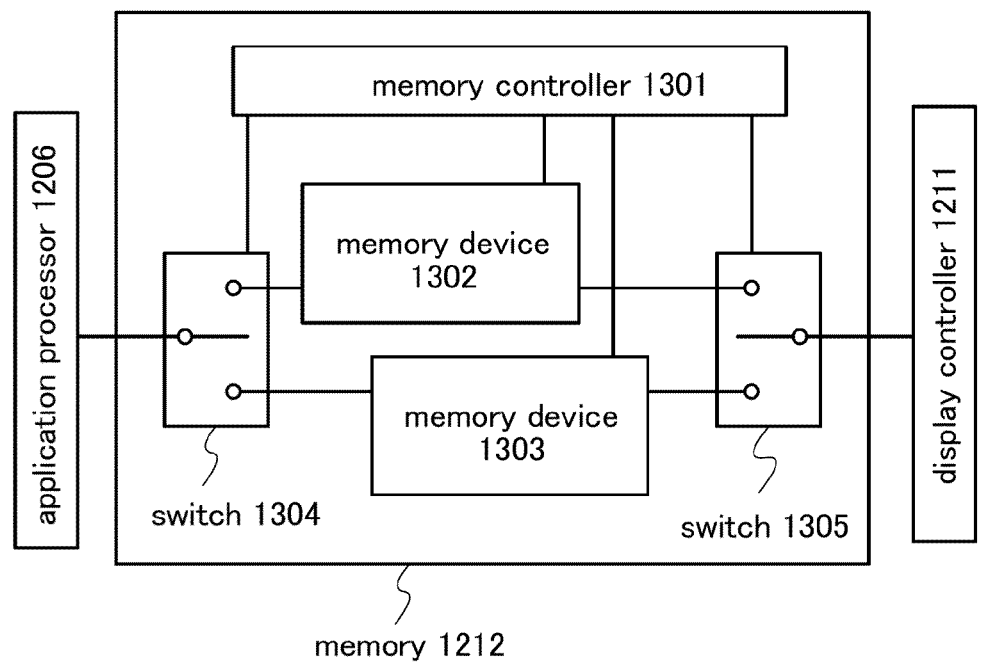
FIG. 11 is a block diagram illustrating an example of a structure of a memory.

An example of a structure of the memory 1212 to which the semiconductor memory device in the above embodiment is applied is illustrated in FIG. 11. A memory illustrated in FIG. 11 includes a memory device 1302 and a memory device 1303 to which the semiconductor memory device in the above embodiment is applied, a switch 1304, a switch 1305, and a memory controller 1301.

Further, an example of operation of the portable device illustrated in FIG. 10 in which the memory illustrated in FIG. 11 is employed as the memory 1212 is described.

First, an image is formed as a result of reception of an electric wave including data, or by the application processor 1206. The formed image is stored in the memory device 1302 as data through the switch 1304. Then, the data stored in the memory device 1302 is output to the display controller 1211 through the switch 1305 and then to the display 1213; an image based on the input image data is displayed by the display 1213. In the case where the image is not changed, the data is read from the memory device 1302 at a frequency of, usually, higher than or equal to 60 Hz and lower than or equal to 130 Hz, and the read data is continuously sent to the display controller 1211 through the switch 1305. In the case where the user carries out an operation to rewrite the image, a new image is formed by the application processor 1206, and the image is stored in the memory device 1303 as data through the switch 1304. Also during this step, the image data is regularly read from the memory device 1302 through the switch 1305. After the new image data is stored in the memory device 1303, in a subsequent frame period of the display 1213, the data stored in the memory device 1303 is read and the read data is output to the display 1213 through the switch 1305 and the display controller 1211. The display 1213 to which the data is input displays an image based on the input image data. The above-described read operation is repeated until when next data is stored in the memory device 1302. Data is written to and read from the memory device 1302 and the memory device 1303 alternately in this manner, whereby the display 1213 displays an image.

Note that the memory device 1302 and the memory device 1303 are not limited to different memory chips; one memory chip may be shared and used as the memory device 1302 and the memory device 1303.

As described above, when the semiconductor memory device in the above embodiment is used for the memory device 1302 and the memory device 1303, a unit price of a memory can be reduced and power consumption can also be reduced.

Figure 12:
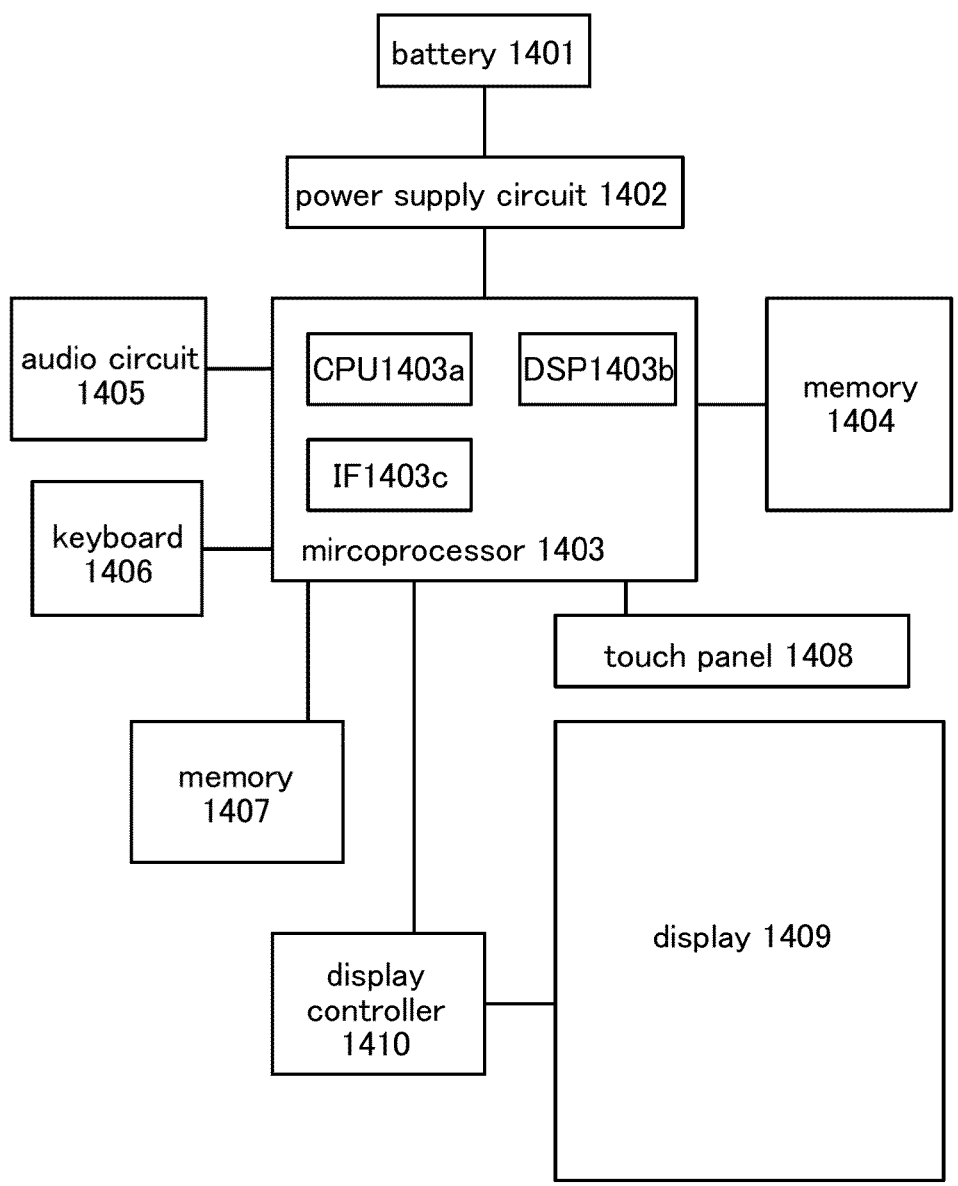
FIG. 12 is a block diagram illustrating an example of a structure of an e-book reader.

FIG. 12 is a block diagram illustrating an example of an e-book reader. In FIG. 12, for example, a battery 1401, a power supply circuit 1402, a microprocessor 1403, a memory 1404 that is a flash memory, an audio circuit 1405, a keyboard 1406, a memory 1407, a touch panel 1408, a display 1409, and a display controller 1410 are included.

The microprocessor 1403 includes, for example, a CPU 1403a, a DSP 1403b, and an IF 1403c.

For example, the semiconductor memory device in the above embodiment can be used for the memory 1407. The memory 1407 temporarily retains the contents of books as data.

A function of the memory 1407 can be applied to, for example, the case where the user utilizes a highlighting function. For example, when the user reads an e-book, the user will put a mark on a specific part in some cases. Such a marking function is called a highlighting function, by which characters are changed in color or type, underlined, or boldfaced, for example, so that a specific part is made to look distinct from the other part. In the function, information about the part specified by the user is stored and retained. In the case where the information is stored for a long time, the information may be copied to the memory 1404.

When the semiconductor memory device in the above embodiment is used as the memory 1407 as described above, a unit price of a memory can be reduced and power consumption can also be reduced.

EXAMPLE 1

A transistor in which an oxide semiconductor including In, Sn, and Zn as main components is used as a channel formation region can have favorable characteristics by depositing the oxide semiconductor while heating a substrate or by performing heat treatment after formation of an oxide semiconductor film. Note that a main component refers to an element included in a composition at 5 atomic % or higher.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 21A:
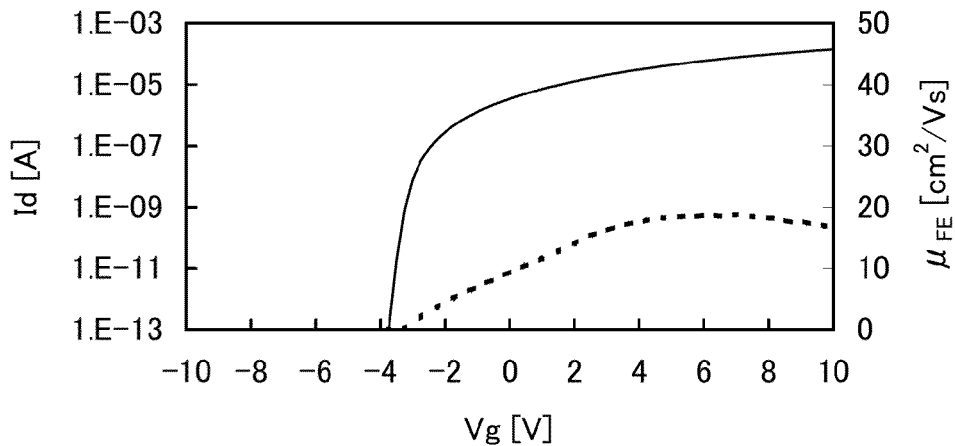
FIGS. 21A to 21C are graphs each showing characteristics of a transistor including an oxide semiconductor film.
Figure 21B:
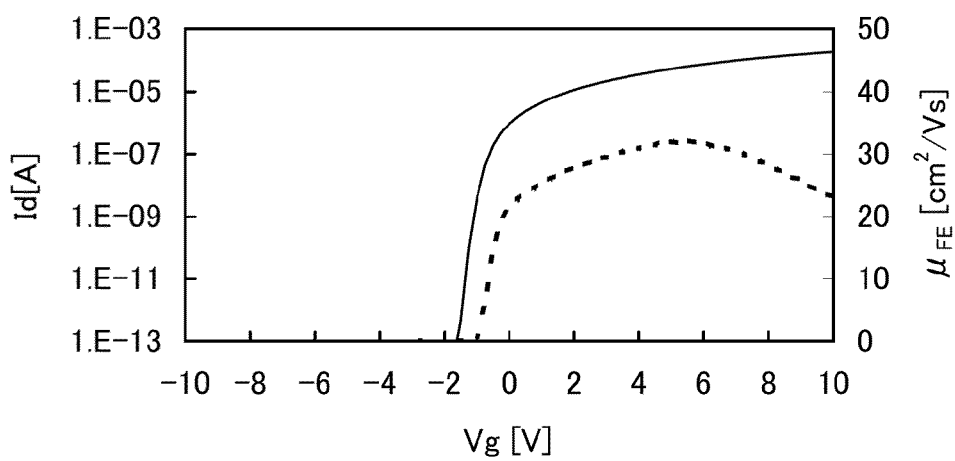
Figure 21C:
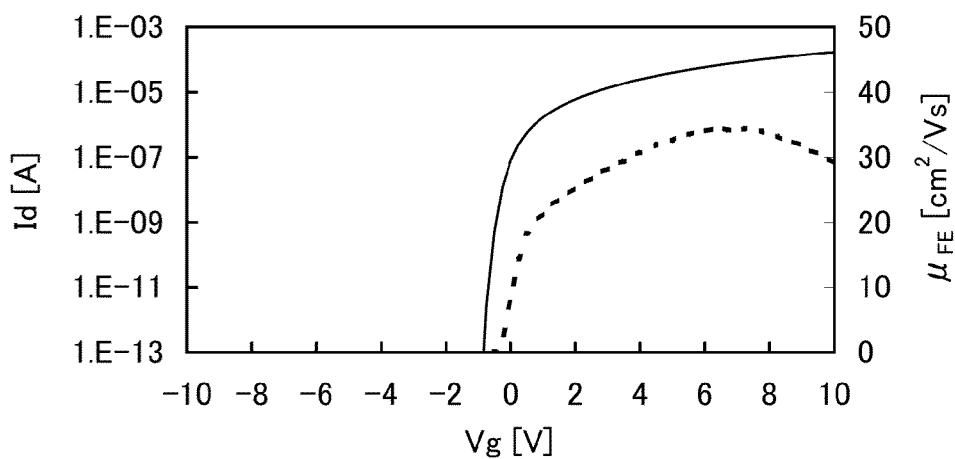

As an example, FIGS. 21A to 21C each show characteristics of a transistor in which an oxide semiconductor film including In, Sn, and Zn as main components and having a channel length L of 3 μm and a channel width W of 10 μm, and a gate insulating layer with a thickness of 100 nm are used. Note that $V_d$ was set to 10 V.

FIG. 21A shows characteristics of a transistor whose oxide semiconductor film including In, Sn, and Zn as main components was formed by sputtering without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 21B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 21C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an advantageous effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case where such a purified non-single-crystal oxide semiconductor is used, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor; hydrogen, a hydroxyl group, or moisture included in the oxide semiconductor is released by heat treatment; and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor whose oxide semiconductor film including In, Sn, and Zn as main components, which is formed without heating a substrate intentionally, is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 21A and 21B.

Note that the threshold voltage can also be controlled by changing the ratio of In, Sn, and Zn; when the composition ratio of In, Sn, and Zn is 2:1:3, a normally-off transistor is expected to be formed. In addition, a highly crystalline oxide semiconductor film can be obtained by setting the composition ratio of a target as follows:In:Sn:Zn=2:1:3.

The temperature of the intentional heating of the substrate or the temperature of the heat treatment is 150° C. or higher, preferably 200° C. or higher, or more preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for 1 hour, drift of the threshold voltage can be less than ±1.5 V, preferably less than ±1.0 V.

A BT test was performed on the following two transistors: Sample 1 on which heat treatment was not performed after formation of an oxide semiconductor film; and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of 20 V was applied so that the intensity of an electric field applied to the gate insulating layer was 2 MV/cm, and the condition was kept for 1 hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of −20 V was applied so that the intensity of an electric field applied to the gate insulating layer was −2 MV/cm, and the condition was kept for 1 hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 22A:
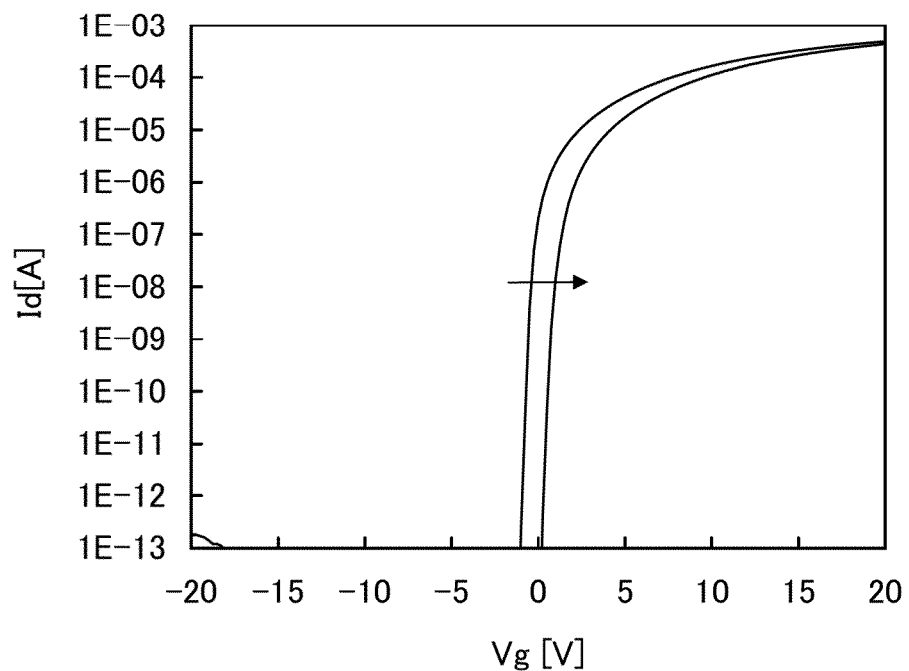
FIGS. 22A and 22B are graphs each showing $V_g$-$I_d$ characteristics of a transistor of Sample 1 which is subjected to a BT test.
Figure 22B:
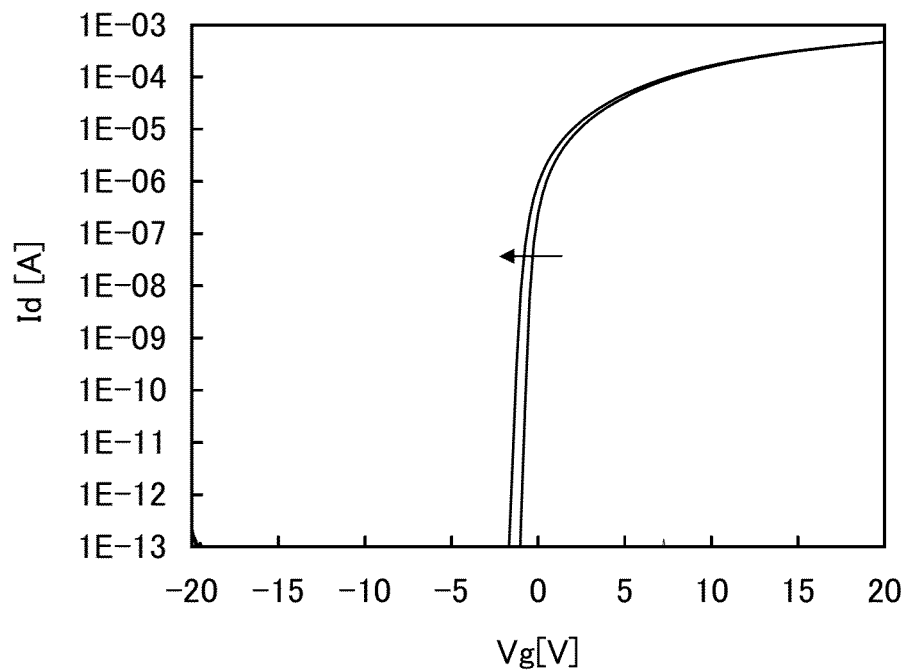
Figure 23A:
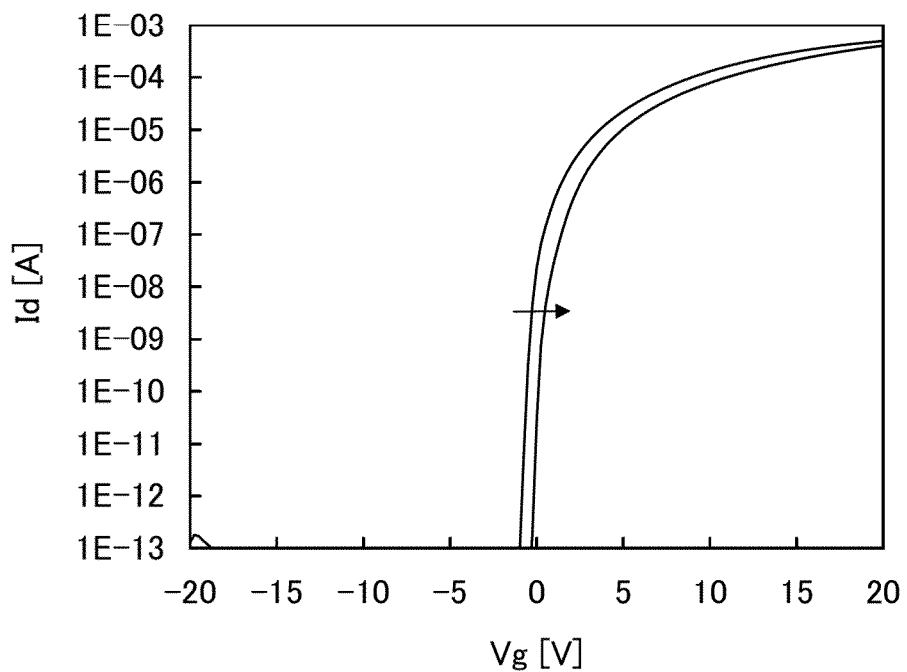
FIGS. 23A and 23B are graphs each showing $V_g$-$I_d$ characteristics of a transistor of Sample 2 which is subjected to a BT test.
Figure 23B:
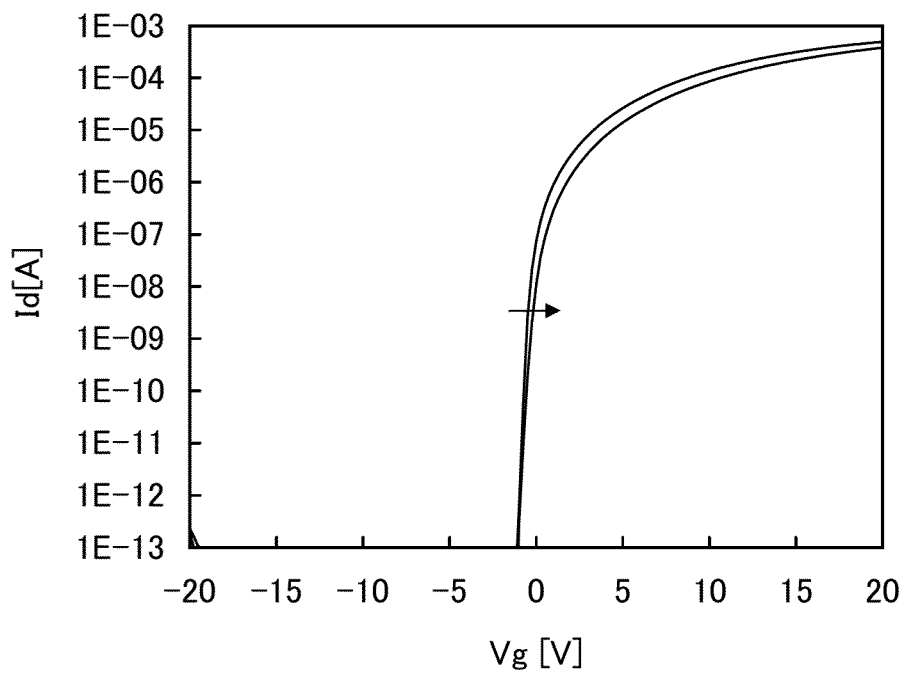

FIGS. 22A and 22B show a result of the positive BT test of Sample 1 and a result of the negative BT test of Sample 1, respectively. FIGS. 23A and 23B show a result of the positive BT test of Sample 2 and a result of the negative BT test of Sample 2, respectively.

The amounts of shift in the threshold voltage of Sample 1 due to the positive BT test and that due to the negative BT test were 1.80 V and −0.42 V, respectively. The amounts of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an advantageous effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is oxygen existing between lattices. When the concentration of excess oxygen is set to higher than or equal to $1\times10^{16}/cm^3$ and lower than or equal to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for 1 hour and heat treatment in an oxygen atmosphere was further performed for 1 hour without lowering the temperature. A sample manufactured in this manner was used as Sample B.

Figure 24:
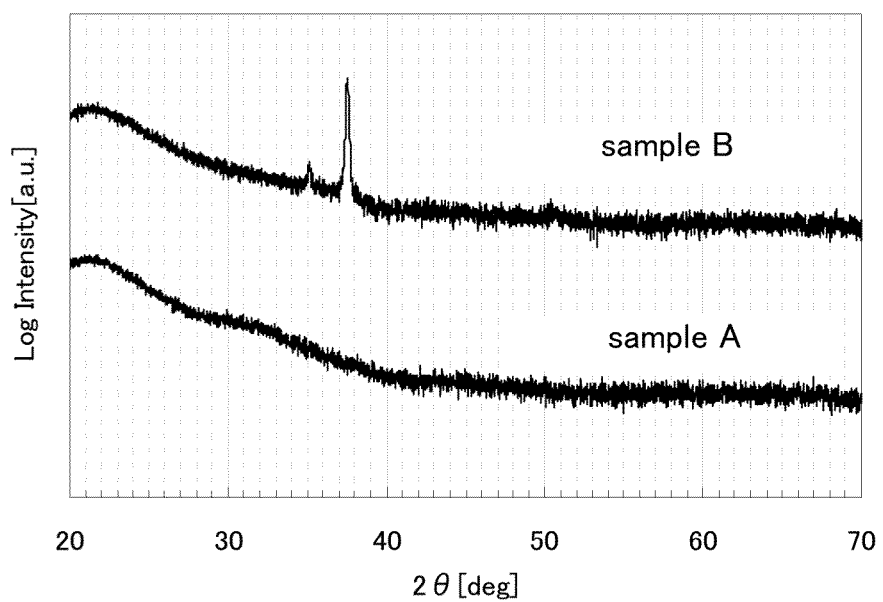
FIG. 24 shows XRD spectra of Sample A and Sample B.

FIG. 24 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating the substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are adverse impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 25:
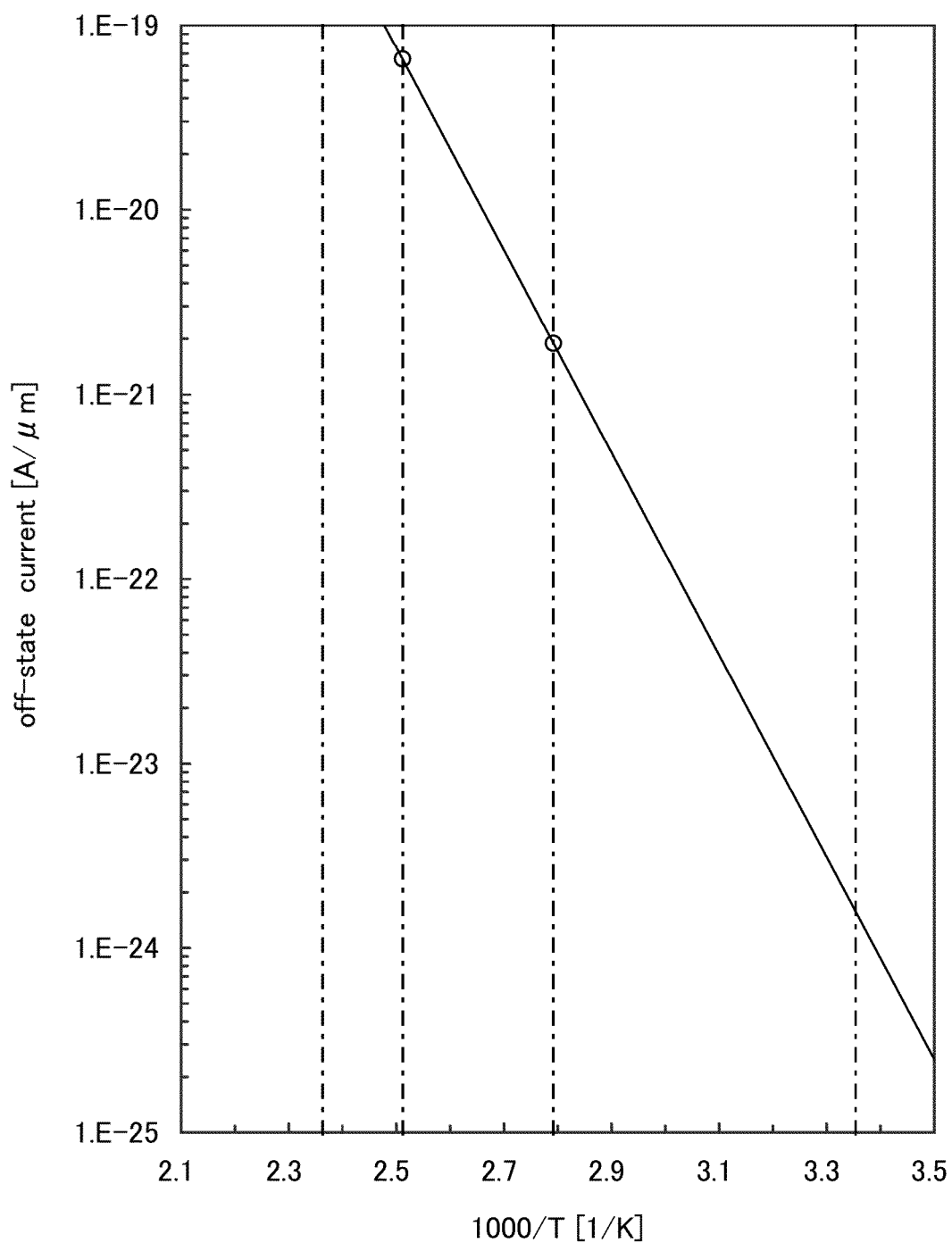
FIG. 25 is a graph showing a relation between off-state current of a transistor and substrate temperature in measurement.

FIG. 25 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 25, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during formation thereof, it is preferable to increase the purity of a sputtering gas by sufficiently suppressing leakage from the outside of a film formation chamber and degasification through an inner wall of the film formation chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of a sample, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 26:
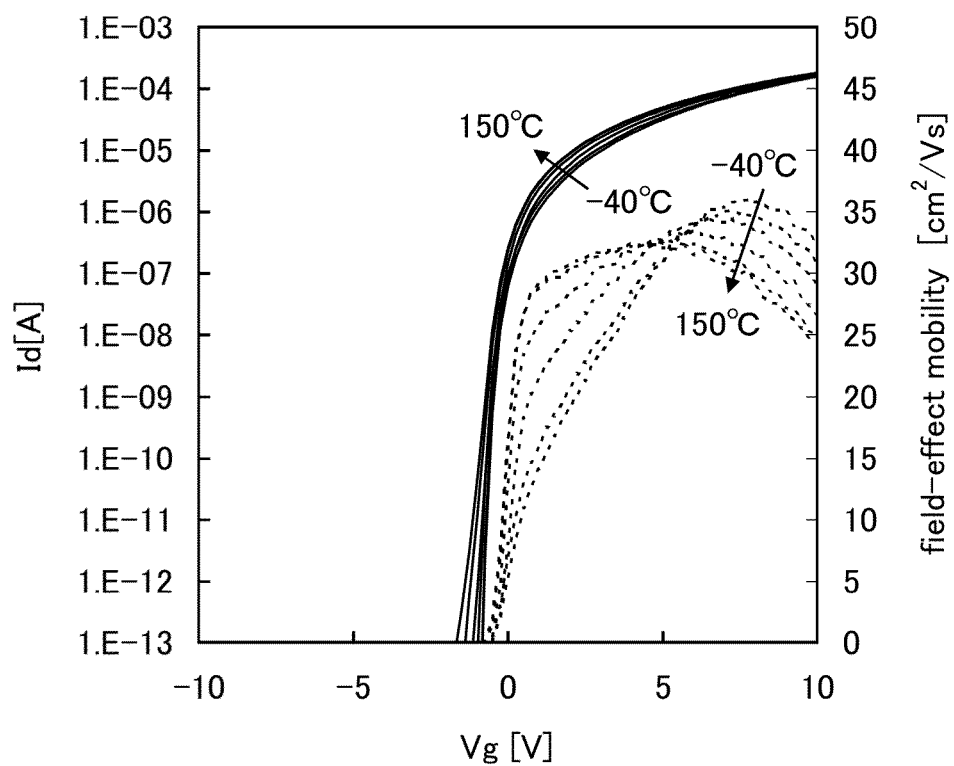
FIG. 26 is a graph showing $V_g$ dependence of $I_d$ and field-effect mobility.
Figure 27A:
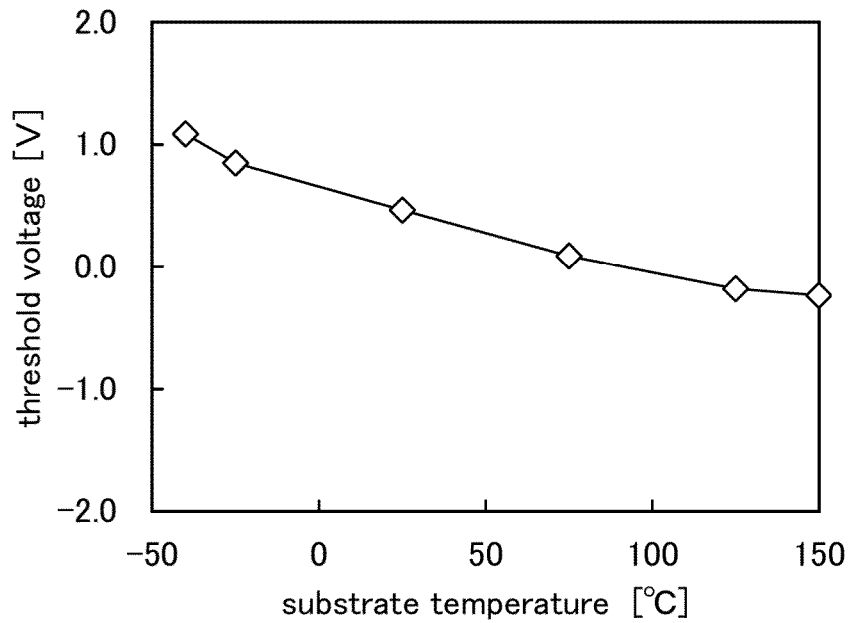
FIG. 27A is a graph showing a relation between substrate temperature and threshold voltage and FIG. 27B is a graph showing a relation between substrate temperature and field-effect mobility.

FIG. 26 shows the $V_g$ dependence of $I_d$ (a solid line) and field-effect mobility (a dotted line). FIG. 27A shows a relation between the substrate temperature and the threshold voltage, and FIG. 27B shows a relation between the substrate temperature and the field-effect mobility.

From FIG. 27A, it is found that the threshold voltage gets lower as the substrate temperature increases. Note that the threshold voltage is decreased from 1.09 V to −0.23 V in the range from −40° C. to 150° C.

Figure 27B:
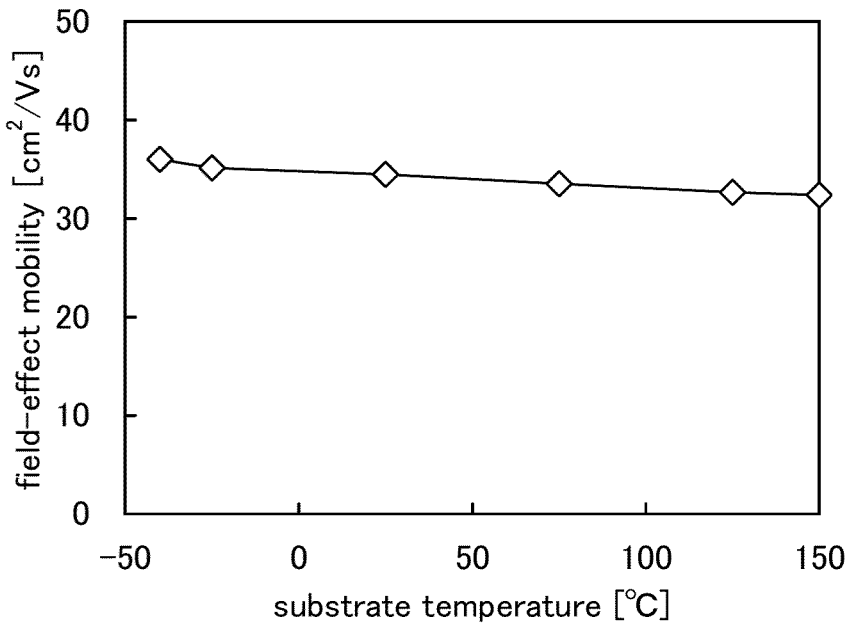

From FIG. 27B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm²/

Vsec or higher, preferably 40 cm²/Vsec or higher, or more preferably 60 cm²/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operating speed even when a transistor including an oxide semiconductor is also provided in an integrated circuit formed using a Si semiconductor.

EXAMPLE 2

In this example, an example of a transistor in which an In—Sn—Zn—O film is used as an oxide semiconductor film will be described with reference to FIGS. 28A and 28B.

Figure 28A:
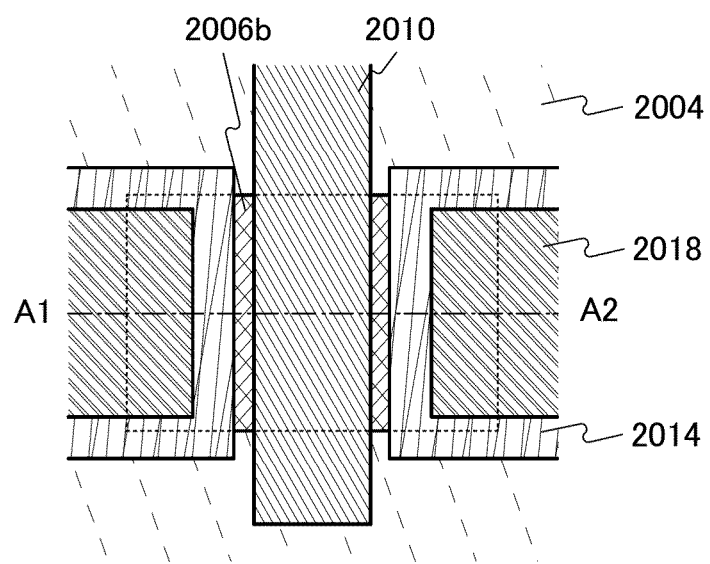
FIGS. 28A and 28B are a top view and a cross-sectional view of a transistor.
Figure 28B:
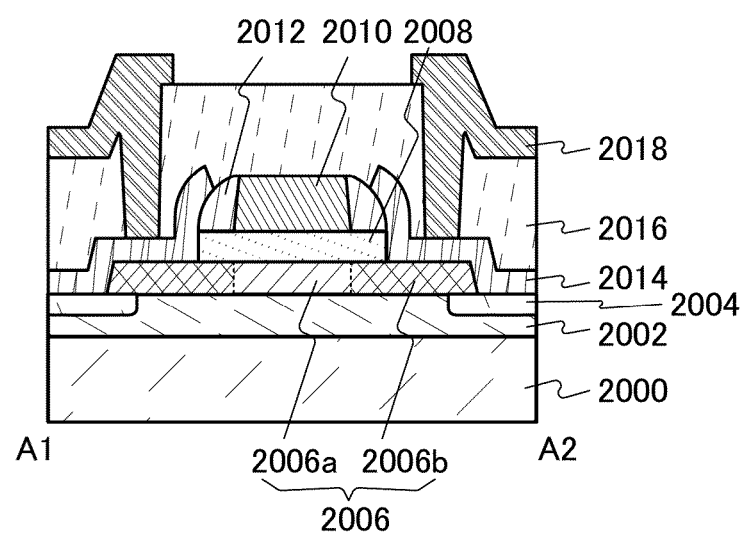

FIGS. 28A and 28B are a top view and a cross-sectional view of a coplanar transistor having a top-gate top-contact structure. FIG. 28A is the top view of the transistor. FIG. 28B illustrates cross section A1-A2 along dashed-dotted line A1-A2 in FIG. 28A.

The transistor illustrated in FIG. 28B includes a substrate 2000; a base insulating film 2002 provided over the substrate 2000; a protective insulating film 2004 provided in the periphery of the base insulating film 2002; an oxide semiconductor film 2006 provided over the base insulating film 2002 and the protective insulating film 2004 and including a high-resistance region 2006a and low-resistance regions 2006b; a gate insulating layer 2008 provided over the oxide semiconductor film 2006; a gate electrode 2010 provided so as to overlap with the oxide semiconductor film 2006 with the gate insulating layer 2008 interposed therebetween; a sidewall insulating film 2012 provided in contact with a side surface of the gate electrode 2010; a pair of electrodes 2014 provided in contact with at least the low-resistance regions 2006b; an interlayer insulating film 2016 provided so as to cover at least the oxide semiconductor film 2006, the gate electrode 2010, and the pair of electrodes 2014; and a wiring 2018 provided so as to be connected to at least one of the pair of electrodes 2014 through an opening formed in the interlayer insulating film 2016.

Although not illustrated, a protective film may be provided so as to cover the interlayer insulating film 2016 and the wiring 2018. With the protective film, a minute amount of leakage current generated by surface conduction of the interlayer insulating film 2016 can be reduced and thus the off-state current of the transistor can be reduced.

EXAMPLE 3

In this example, another example of a transistor in which an In—Sn—Zn—O film is used as an oxide semiconductor film will be described.

Figure 29A:
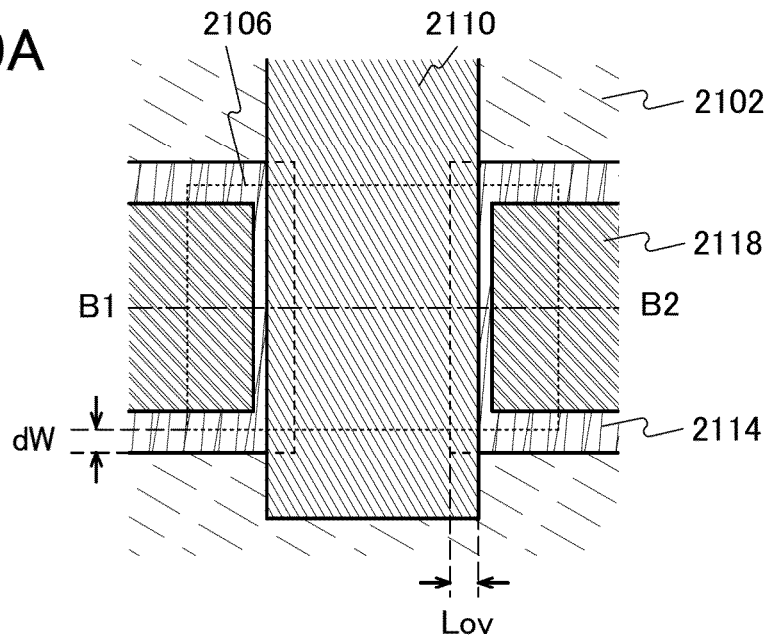
FIGS. 29A and 29B are a top view and a cross-sectional view of a transistor.
Figure 29B:
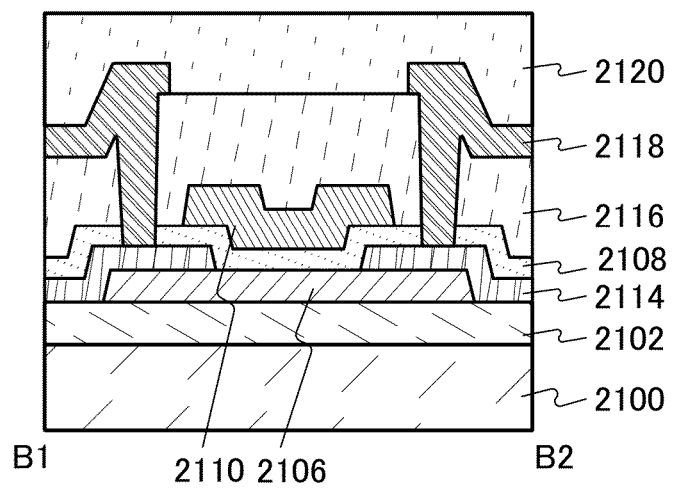

FIGS. 29A and 29B are a top view and a cross-sectional view which illustrate a structure of a transistor manufactured in this example. FIG. 29A is the top view of the transistor. FIG. 29B is a cross-sectional view along dashed-dotted line B1-B2 in FIG. 29A.

The transistor illustrated in FIG. 29B includes a substrate 2100; a base insulating film 2102 provided over the substrate 2100; an oxide semiconductor film 2106 provided over the base insulating film 2102; a pair of electrodes 2114 provided in contact with the oxide semiconductor film 2106; a gate insulating layer 2108 provided over the oxide semiconductor film 2106 and the pair of electrodes 2114; a gate electrode 2110 provided so as to overlap with the oxide semiconductor film 2106 with the gate insulating layer 2108 interposed therebetween; an interlayer insulating film 2116 provided so as to cover the gate insulating layer 2108 and the gate electrode 2110; wirings 2118 connected to the pair of electrodes 2114 through openings formed in the interlayer insulating film 2116; and a protective film 2120 provided so as to cover the interlayer insulating film 2116 and the wirings 2118.

As the substrate 2100, a glass substrate was used. As the base insulating film 2102, a silicon oxide film was used. As the oxide semiconductor film 2106, an In—Sn—Zn—O film was used. As the pair of electrodes 2114, a tungsten film was used. As the gate insulating layer 2108, a silicon oxide film was used. The gate electrode 2110 had a stacked-layer structure of a tantalum nitride film and a tungsten film. The interlayer insulating film 2116 had a stacked-layer structure of a silicon oxynitride film and a polyimide film. The wirings 2118 each had a stacked-layer structure in which a titanium film, an aluminum film, and a titanium film were formed in this order. As the protective film 2120, a polyimide film was used.

Note that in the transistor having the structure illustrated in FIG. 29A, the width of a portion where the gate electrode 2110 overlaps with one of the pair of electrodes 2114 is referred to as Lov. Similarly, the width of a portion where the pair of electrodes 2114, which does not overlap with the oxide semiconductor film 2106, is referred to as dW.

This application is based on Japanese Patent Application serial No. 2010-292496 filed with Japan Patent Office on Dec. 28, 2010 and Japanese Patent Application serial No. 2011-112538 filed with Japan Patent Office on May 19, 2011, the entire contents of which are hereby incorporated by reference.

What is claimed is:

1. A semiconductor device comprising a memory circuit, the memory circuit comprising:
   a first transistor;
   a second transistor; and
   a rectifier element comprising a pair of current terminals with a first region having a first conductivity type semiconductor and a second region having a second, different conductivity type semiconductor interposed therebetween, wherein the first region and the second region are in contact with each other, wherein one of a source and a drain of the first transistor is configured to receive a data signal,
   wherein a gate of the second transistor is electrically connected to the other of the source and the drain of the first transistor,
   wherein one of the current terminals is electrically connected to a source or a drain of the second transistor,
   wherein the first transistor comprises an oxide semiconductor layer,
   wherein a first channel formation region is formed within the oxide semiconductor layer, and
   wherein the first transistor is formed over the second transistor and the rectifier.

2. The semiconductor device according to claim 1,
   wherein the second transistor comprises a semiconductor layer comprising silicon, and
   wherein a second channel formation region is formed within the semiconductor layer.

3. The semiconductor device according to claim 1, wherein the oxide semiconductor layer comprises a pair of regions which are separated from each other, to which a dopant is added, and between which the first channel formation region is formed.

4. The semiconductor device according to claim 1,
wherein the first channel formation region comprises In, Ga, and Zn,
wherein the first channel formation region comprises a crystalline structure,
wherein the first channel formation region comprises a phase having a triangular, hexagonal, regular triangular, or regular hexagonal atomic arrangement when seen from a direction perpendicular to an a-b plane, and
wherein in the first channel formation region, metal atoms are arranged in a layered manner when seen from a direction perpendicular to a c-axis direction or metal atoms and oxygen atoms are arranged in a layered manner when seen from the direction perpendicular to the c-axis direction.

5. A semiconductor memory device comprising:
a plurality of memory cells arranged in a matrix;
first wirings;
second wirings; and
third wirings,
each of the plurality of memory cells comprising:
 a first transistor;
 a second transistor; and
 a rectifier element comprising a pair of current terminals with a first region having a first conductivity type semiconductor and a second region having a second, different conductivity type semiconductor interposed therebetween,
wherein the first region and the second region are in contact with each other;
wherein one of a source and a drain of the first transistor is electrically connected to one of the first wirings,
wherein a gate of the first transistor is electrically connected to one of the second wirings,
wherein one of a source and a drain of the second transistor is electrically connected to one of the third wirings,
wherein a gate of the second transistor is electrically connected to the other of the source and the drain of the first transistor,
wherein one of the current terminals is electrically connected to the other of the source and the drain of the second transistor,
wherein the other of the current terminals is electrically connected to a corresponding one of the first wirings,
wherein the first transistor comprises an oxide semiconductor layer,
wherein a first channel formation region is formed within the oxide semiconductor layer, and
wherein the first transistor is formed over the second transistor and the rectifier.

6. The semiconductor memory device according to claim 5,
wherein the second transistor comprises a semiconductor layer comprising silicon, and
wherein a second channel formation region is formed within the semiconductor layer.

7. The semiconductor memory device according to claim 5, wherein the oxide semiconductor layer comprises a pair of regions which are separated from each other, to which a dopant is added, and between which the first channel formation region is formed.

8. The semiconductor memory device according to claim 5,
wherein the first channel formation region comprises In, Ga, and Zn,
wherein the first channel formation region comprises a crystalline portion,
wherein the first channel formation region comprises a phase having a triangular, hexagonal, regular triangular, or regular hexagonal atomic arrangement when seen from a direction perpendicular to an a-b plane, and
wherein in the first channel formation region, metal atoms are arranged in a layered manner when seen from a direction perpendicular to a c-axis direction or metal atoms and oxygen atoms are arranged in a layered manner when seen from the direction perpendicular to the c-axis direction.

* * * * *